US008659028B2

(12) United States Patent
Scheuerlein et al.

(10) Patent No.: US 8,659,028 B2
(45) Date of Patent: Feb. 25, 2014

(54) THREE-DIMENSIONAL MEMORY DEVICE INCORPORATING SEGMENTED ARRAY LINE MEMORY ARRAY

(75) Inventors: Roy E. Scheuerlein, Cupertino, CA (US); Alper Ilkbahar, San Jose, CA (US); Luca G. Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 1110 days.

(21) Appl. No.: 11/764,789

(22) Filed: Jun. 18, 2007

(65) Prior Publication Data

US 2007/0263423 A1    Nov. 15, 2007

Related U.S. Application Data

(63) Continuation of application No. 10/403,752, filed on Mar. 31, 2003, now Pat. No. 7,233,024.

(51) Int. Cl.
H01L 27/10 (2006.01)
(52) U.S. Cl.
USPC ............ 257/74; 257/390; 257/529; 257/910; 257/E27.026
(58) Field of Classification Search
USPC ............ 257/390, 499, 910, E27.026, 74, 529; 365/51, 63, 230.03, 230.04
See application file for complete search history.

(56) References Cited

U.S. PATENT DOCUMENTS

| 4,500,905 | A | * | 2/1985 | Shibata ........................... 257/74 |
| 4,602,354 | A | | 7/1986 | Craycraft et al. |
| 4,612,083 | A | | 9/1986 | Yasumoto et al. |
| 4,646,266 | A | | 2/1987 | Ovshinsky et al. |
| 4,868,616 | A | | 9/1989 | Johnson et al. |
| 5,301,144 | A | | 4/1994 | Kohno |
| 5,315,541 | A | | 5/1994 | Harari et al. |
| 5,429,968 | A | | 7/1995 | Koyama |
| 5,568,421 | A | | 10/1996 | Aritome |

(Continued)

FOREIGN PATENT DOCUMENTS

| EP | 0 073 486 A2 | 3/1983 |
| EP | 0 395 886 A2 | 11/1990 |

(Continued)

OTHER PUBLICATIONS

Greene et al.; Antifuse Field Programmable Gate Array; Jul. 1993; Proceedings of the IEEE, vol. 81, Issue 7; pp. 1042-1056.*

(Continued)

Primary Examiner — Marcos D. Pizarro
(74) Attorney, Agent, or Firm — Dugan & Dugan, PC

(57) ABSTRACT

A three-dimensional (3D) high density memory array includes multiple layers of segmented bit lines (i.e., sense lines) with segment switch devices within the memory array that connect the segments to global bit lines. The segment switch devices reside on one or more layers of the integrated circuit, preferably residing on each bit line layer. The global bit lines reside preferably on one layer below the memory array, but may reside on more than one layer. The bit line segments preferably share vertical connections to an associated global bit line. In certain EEPROM embodiments, the array includes multiple layers of segmented bit lines with segment connection switches on multiple layers and shared vertical connections to a global bit line layer. Such memory arrays may be realized with much less write-disturb effects for half selected memory cells, and may be realized with a much smaller block of cells to be erased.

45 Claims, 12 Drawing Sheets

(56) References Cited

U.S. PATENT DOCUMENTS

| | | | |
|---|---|---|---|
| 5,621,683 A | 4/1997 | Young | |
| 5,715,189 A * | 2/1998 | Asakura | 365/72 |
| 5,734,609 A | 3/1998 | Choi et al. | |
| 5,751,012 A | 5/1998 | Wolstenholme et al. | |
| 5,835,396 A | 11/1998 | Zhang | |
| 5,909,393 A | 6/1999 | Tran et al. | |
| 5,926,415 A | 7/1999 | Shin | |
| 5,969,990 A | 10/1999 | Arase | |
| 5,991,193 A | 11/1999 | Gallagher et al. | |
| 6,004,825 A | 12/1999 | Seyyedy | |
| 6,005,270 A | 12/1999 | Noguchi | |
| 6,034,882 A | 3/2000 | Johnson et al. | |
| 6,055,180 A | 4/2000 | Gudesen et al. | |
| 6,115,287 A | 9/2000 | Shimizu et al. | |
| 6,128,214 A | 10/2000 | Kuekes et al. | |
| 6,130,835 A | 10/2000 | Scheuerlein | |
| 6,163,048 A | 12/2000 | Hirose et al. | |
| 6,185,121 B1 | 2/2001 | O'Neill | |
| 6,185,122 B1 | 2/2001 | Johnson et al. | |
| 6,266,275 B1 | 7/2001 | Chen et al. | |
| 6,324,093 B1 | 11/2001 | Perner et al. | |
| 6,335,890 B1 | 1/2002 | Reohr et al. | |
| 6,356,477 B1 | 3/2002 | Tran | |
| 6,363,000 B2 | 3/2002 | Perner et al. | |
| 6,411,548 B1 | 6/2002 | Sakui et al. | |
| 6,420,215 B1 | 7/2002 | Knall et al. | |
| 6,421,271 B1 | 7/2002 | Gogl et al. | |
| 6,445,613 B1 | 9/2002 | Nagai | |
| 6,452,860 B2 | 9/2002 | Wada et al. | |
| 6,462,979 B2 | 10/2002 | Schlösser et al. | |
| 6,473,328 B1 | 10/2002 | Mercaldi | |
| 6,477,077 B1 | 11/2002 | Okazawa | |
| 6,490,194 B2 | 12/2002 | Hoenigschmid | |
| 6,498,747 B1 | 12/2002 | Gogl et al. | |
| 6,504,246 B2 * | 1/2003 | Roth et al. | 257/750 |
| 6,515,888 B2 | 2/2003 | Johnson et al. | |
| 6,522,594 B1 | 2/2003 | Scheuerlein | |
| 6,525,953 B1 | 2/2003 | Johnson | |
| 6,534,403 B2 | 3/2003 | Cleeves | |
| 6,542,407 B1 | 4/2003 | Chen et al. | |
| 6,545,898 B1 | 4/2003 | Scheuerlein | |
| 6,567,287 B2 | 5/2003 | Scheuerlein | |
| 6,584,006 B2 | 6/2003 | Viehmann | |
| 6,611,453 B2 | 8/2003 | Ning | |
| 6,618,295 B2 | 9/2003 | Scheuerlein | |
| 6,628,564 B1 | 9/2003 | Takita et al. | |
| 6,631,085 B2 | 10/2003 | Kleveland et al. | |
| 6,687,147 B2 | 2/2004 | Fricke et al. | |
| 6,737,675 B2 | 5/2004 | Patel et al. | |
| 6,754,102 B2 | 6/2004 | Kleveland et al. | |
| 6,777,773 B2 | 8/2004 | Knall | |
| 6,780,711 B2 | 8/2004 | Johnson et al. | |
| 6,785,157 B2 | 8/2004 | Arimoto et al. | |
| 6,807,119 B2 | 10/2004 | Fasoli et al. | |
| 6,813,199 B2 | 11/2004 | Hidaka | |
| 6,822,903 B2 | 11/2004 | Scheuerlein et al. | |
| 6,845,042 B2 | 1/2005 | Ichige et al. | |
| 6,879,505 B2 | 4/2005 | Scheuerlein | |
| 6,882,557 B2 | 4/2005 | Kajigaya et al. | |
| 6,888,750 B2 | 5/2005 | Walker et al. | |
| 6,912,152 B2 | 6/2005 | Iwata et al. | |
| 7,002,825 B2 | 2/2006 | Scheuerlein | |
| 7,005,350 B2 | 2/2006 | Walker et al. | |
| 7,106,652 B2 | 9/2006 | Scheuerlein | |
| 7,177,169 B2 | 2/2007 | Scheuerlein | |
| 7,233,024 B2 | 6/2007 | Scheuerlein et al. | |
| 7,505,321 B2 | 3/2009 | Scheuerlein et al. | |
| 2002/0028541 A1 | 3/2002 | Lee et al. | |
| 2003/0095448 A1 | 5/2003 | Ichige et al. | |
| 2003/0109093 A1 | 6/2003 | Harari et al. | |
| 2003/0128581 A1 | 7/2003 | Scheuerlein et al. | |
| 2003/0214835 A1 | 11/2003 | Nejad et al. | |
| 2003/0227795 A1 | 12/2003 | Seyyedy et al. | |
| 2003/0235063 A1 | 12/2003 | Van Brocklin et al. | |
| 2004/0002184 A1 | 1/2004 | Cleeves | |
| 2004/0057276 A1 | 3/2004 | Nejad et al. | |
| 2004/0100852 A1 | 5/2004 | Scheuerlein et al. | |
| 2004/0119122 A1 | 6/2004 | Ilkbahar et al. | |
| 2004/0124415 A1 | 7/2004 | Walker et al. | |
| 2004/0125629 A1 | 7/2004 | Scheuerlein et al. | |
| 2004/0125653 A1 | 7/2004 | Tran et al. | |
| 2005/0012119 A1 | 1/2005 | Herner et al. | |
| 2005/0012120 A1 | 1/2005 | Herner et al. | |
| 2005/0012154 A1 | 1/2005 | Herner et al. | |
| 2005/0012220 A1 | 1/2005 | Vyvoda et al. | |
| 2005/0014322 A1 | 1/2005 | Herner et al. | |
| 2005/0014334 A1 | 1/2005 | Herner et al. | |
| 2005/0018485 A1 | 1/2005 | Noguchi et al. | |
| 2012/0106253 A1 | 5/2012 | Scheuerlein et al. | |

FOREIGN PATENT DOCUMENTS

| | | |
|---|---|---|
| EP | 0 924 709 A2 | 6/1999 |
| JP | 2001028427 A * | 1/2001 |
| WO | WO 0079597 A1 * | 12/2000 |
| WO | WO 0243067 A2 * | 5/2002 |

OTHER PUBLICATIONS

Nlshihara et al.; A quasi-matrix ferroelectric memory for future silicon storage; Nov. 2002; IEEE Journal of Solid State Circuits, vol. 37, Issue 11; pp. 1479-1484.*

Naji, Peter K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

Durlam, M., et al., "Nonvolatile RAM Based on Magnetic Tunnel Junction Elements," 2000 IEEE ISSCC, Feb. 8, 2000, pp. 130-131.

Greene, Jonathan, et al., "Antifuse Field Programmable Gate Arrays," Proceedings of the IEEE, vol. 81, No. 7, New York, Jul. 1993, pp. 1042-1056.

Takeuchi, Ken, et al., "A Negative Vth Cell Architecture for Highly Scalable, Excellently Noise-Immune, and Highly Reliable NAND Flash Memories," IEEE Journal of Solid-State Circuits, vol. 34, No. 5, May 1999, pp. 675-684.

Nishihara, Toshiyuki, et al., "A Quasi-Matrix Ferroelectric Memory for Future Silicon Storage," IEEE Journal of Solid-State Circuits, vol. 37, No. 11, Nov. 2002, pp. 1479-1484.

Sugibayashi, Tadahiko, et al., "A 30-ns. 256-Mb DRAM with a Multidivided Array Structure," IEEE Journal of Solid-State Circuits, vol. 28, No. 11, Nov. 1993, pp. 1092-1098.

Evans, Robert J., et al., "Energy Consumption Modeling and Optimization for SRAM's," IEEE Journal of Solid-State Circuits, vol. 30, No. 5, May 1995, pp. 571-579.

Crowley et al., "512Mb PROM with 8 Layers of Antifuse/Diode Cells", 2003 IEEE ISSCC Conference, Session 16, Non-Volatile Memory, Paper 16.4, pp. 1-3, and corresponding presentation slides (26 pages).

Sep. 11, 2013 Response to Jun. 11, 2013 Office Action of U.S. Appl. No. 13/348,336.

Herner et al., U.S. Appl. No. 10/326,470; entitled "An Improved Method for Making High-Density Nonvolatile Memory," filed Dec. 19, 2002.

Restriction Requirement of U.S. Appl. No. 10/403,752 mailed Jan. 13, 2005.

Jan. 27, 2005 Reply to Jan. 13, 2005 Restriction Requirement of U.S. Appl. No. 10/403,752.

Restriction Requirement of U.S. Appl. No. 10/403,752 mailed Mar. 3, 2005.

Apr. 4, 2005 Reply to Mar. 3, 2005 Restriction Requirement of U.S. Appl. No. 10/403,752.

Office Action of U.S. Appl. No. 10/403,752 mailed Apr. 20, 2005.

Aug. 20, 2005 Reply to Apr. 20, 2005 Office Action of U.S. Appl. No. 10/403,752.

Final Office Action of U.S. Appl. No. 10/403,752 mailed Nov. 14, 2005.

Mar. 15, 2006 Reply to Nov. 14, 2005 Final Office Action of U.S. Appl. No. 10/403,752.

Advisory Action of U.S. Appl. No. 10/403,752 mailed Apr. 7, 2006.

Office Action of U.S. Appl. No. 10/403,752 mailed May 2, 2006.

(56) References Cited

OTHER PUBLICATIONS

Aug. 3, 2006 Reply to May 2, 2006 Office Action of U.S. Appl. No. 10/403,752 mailed May 2, 2006.
Final Office Action of U.S. Appl. No. 10/403,752 mailed Sep. 11, 2006.
Jan. 11, 2007 Reply to Sep. 11, 2006 Final Office Action of U.S. Appl. No. 10/403,752 mailed Sep. 11, 2006.
Notice of Allowance of U.S. Appl. No. 10/403,752 mailed Feb. 12, 2007.
Restriction Requirement of U.S. Appl. No. 13/348,336 mailed Apr. 17, 2013.
May 17, 2013 Reply to Apr. 17, 2013 Restriction Requirement of U.S. Appl. No. 13/348,336.
Office Action of U.S. Appl. No. 13/348,336 mailed Jun. 11, 2013.
International Search Report of International Application No. PCT/US04/09756 dated Mar. 21, 2005.
International Preliminary Report on Patentability and Written Opinion of International Application No. PCT/US04/09756 dated Oct. 1, 2005.
Notice of Allowance of U.S. Appl. No. 13/348,336 mailed Sep. 30, 2013.

* cited by examiner

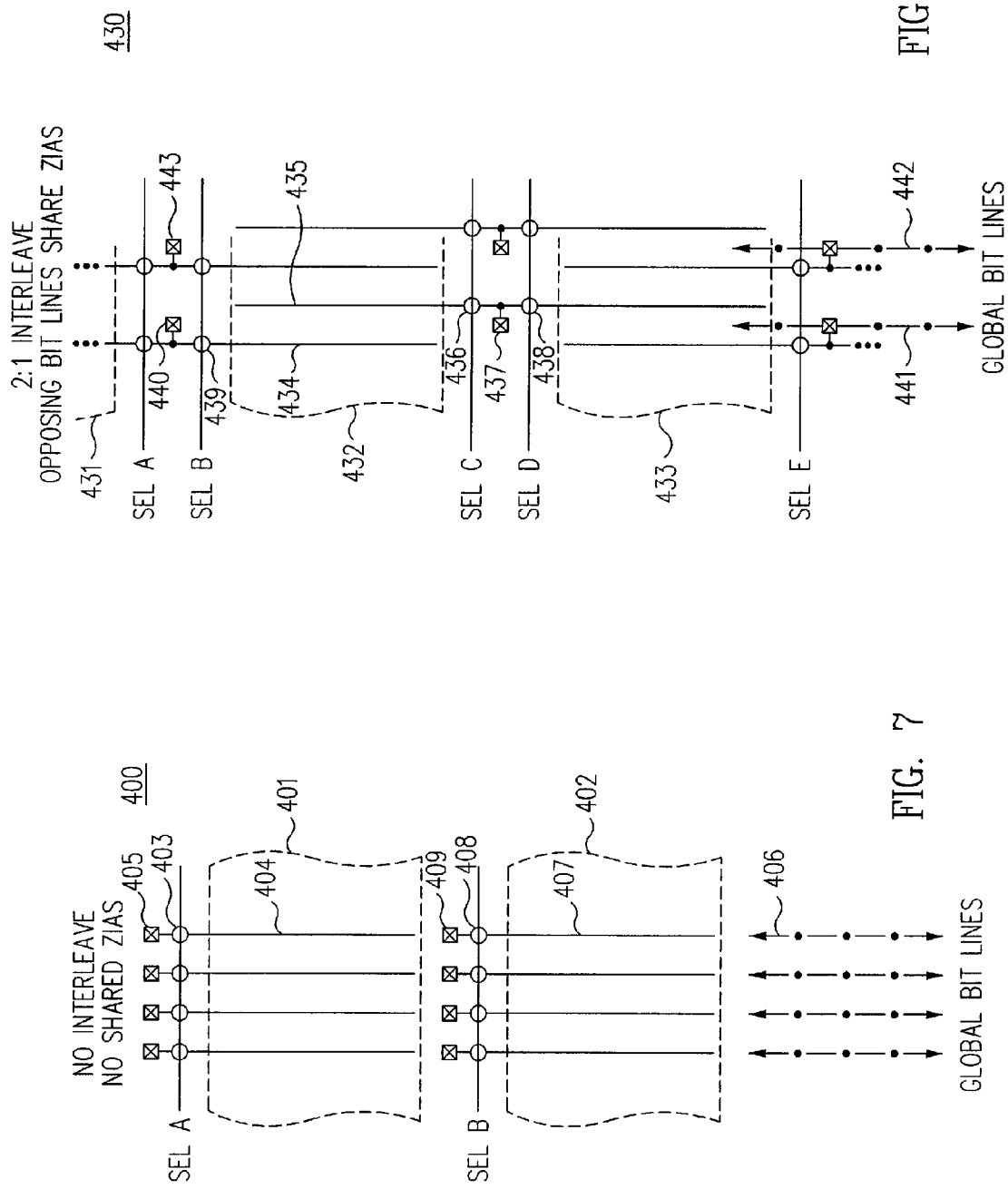

THREE-DIMENSIONAL MEMORY DEVICE INCORPORATING SEGMENTED ARRAY LINE MEMORY ARRAY

CROSS-REFERENCE TO RELATED APPLICATION(S)

This application is a continuation application of co-pending U.S. application Ser. No. 10/403,752 by Roy E. Scheuerlein, et al, entitled "Three-Dimensional Memory Device Incorporating Segmented Bit Line Memory Array", filed on Mar. 31, 2003, which application is hereby incorporated by reference in its entirety.

FIELD OF THE INVENTION

The present invention relates to semiconductor integrated circuits containing memory arrays, and in preferred embodiments the invention particularly relates to monolithic three-dimensional memory arrays.

BACKGROUND

Recent developments in semiconductor processing technologies and memory cell technologies have continued to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication," and in U.S. Pat. No. 5,835,396 to Zhang, entitled "Three-Dimensional Read-Only Memory."

A variety of other memory cell technologies and arrangements are also known. For example, NAND flash and NROM flash EEPROM memory arrays are known to achieve relatively small memory cells. Other small flash EEPROM cells are known which use hot electron programming, such as NROM and floating gate NOR flash memory arrays. Such memory cells may also be desirable for a 3D memory array, although they frequently use many masks to produce a memory layer, and some use relatively high programming currents. Yet other memory cell technologies include Dynamic Random Access Memory (DRAM) type of memory cells, and Ferro-electric (FeRAM) memory cells.

A three-dimensional (3D) memory array is most efficient when the number of cell on each bit line and word line is large. This number of cells is frequently called the fan-out (N) of the bit line and the word line. A large fan-out reduces the number of vertical connections between the array lines on each memory layer and the circuitry below. These vertical connections cannot lie beneath the individual memory cells on each layer, and thus may add significantly to the chip area. But a large fan-out frequently has certain electrical disadvantages depending on the memory cell technology being used. For example, the capacitance of array lines and the resistance of array lines may increase by the fan-out (N) factor, and leakage per cell may cause power dissipation to increase by a factor of $N^2$. Of particular interest, a large fan-out EEPROM array causes interaction between all the cells within a range defined by the fan-out of the bit line and the fan-out of the word line. This interaction is detrimental for EEPROM arrays because it causes a partial, but cumulative, disturb of some bits while reading or writing other bits. It also defines the so-called erase block size, since all the cells in an interacting group are erased at the same time. The memory cells which are disturbed during writing are those that are "half-selected" cells, which are memory cells that are connected to either the currently selected word line or the currently selected bit line, but not both. Because the number of half-selected cells increases with increasing fan-out, and because the amount a cell is disturbed is a cumulative effect of a great number of cycles (which varies with fan out proportional to $N^2$), the data in those cells could easily be destroyed if the array line fan-outs were large. As a result, 3D memory arrays must make a fan-out trade-off between electrical requirements and layout efficiency that is particularly detrimental in 3D EEPROM arrays.

Many two-dimensional (2D) memory arrays (i.e., having only a single memory plane) segment the memory array lines and connect the segments to longer lines. Examples include Flash EEPROM devices, which segment the bit lines, DRAMs which segment the word line and sometimes the bit line, and SRAMs which segment the word line. Such devices have the segment switches on one layer (e.g., within the silicon substrate), and have a different layer for memory cells with segmented lines, and one layer of long lines (e.g., global lines). Despite such progress, memory arrays having even greater density are desirable. In particular, a memory array configuration more easily fashioned into a three-dimensional memory array is highly desired.

BRIEF SUMMARY

In certain embodiments, the present invention provides a three-dimensional (3D) high density memory array with array lines that can be short in at least one direction, by having multiple layers of segmented bit lines (e.g., sense lines) with segment switch devices within the memory array that connect the segments to global bit lines. The segment switch devices reside on one or more layers of the integrated circuit, preferably residing on each bit line layer. The global bit lines reside preferably on one layer below the memory array, but in some embodiments may reside on more than one layer. In some embodiments, the bit line segments share vertical connections to an associated global bit line. The capacitance per unit length of the global bit line is lower than that of the bit line segments because the global bit line does not bear the capacitance of unselected bit line segments, and thus the overall capacitance of the bit line during sensing is reduced because only one of the many segmented bit lines associated with a given column is coupled to the global bit line.

The overall resistance of the combined bit line may also be reduced because the global bit line may be implemented having a larger pitch than the bit line segments, and also may be implemented using a lower resistance material than the usually much shorter segmented bit lines that may be implemented using a material having a relatively high resistance per unit length. This invention also provides for a 3D memory array which reduces power consumption by segmenting the memory array lines in at lease one direction into small pieces, thereby partitioning the array into many small array blocks, only one of which needs to be fully active.

In some embodiments, the present invention provides a three-dimensional electrically erasable read-only memory (EEROM) array by means of an arrangement of multiple layers of segmented bit lines with segment connection switches on multiple layers and shared vertical connections to a global bit line layer. Such memory arrays may be realized with much less write-disturb effects for half selected memory cells (i.e., those coupled to either the selected word line or selected bit line segment, but not both), and may be realized with a much smaller block of cells to be erased.

Other types of memory cells may be implemented into arrays in accordance with the present invention. For example, passive element memory cell arrays (PEMA) may be fashioned having bit line segments on more than one layer of a three-dimensional memory array, each with a segment selection device (or other suitable segment isolation device) connecting, when selected, the segment to an associated global bit line. Such PEMA arrays may incorporate write-once memory cells or write-many memory cells, and may be fuse-type cells or anti-fuse type cells.

The invention is particularly advantageous for memory technologies that form a switch device as part of the memory cell, such as a 3D EEPROM array. The segment selection switch may be conveniently formed of the same type of switch device as the memory cell, or alternatively may be a similar type of device. A memory array using a cell switch device for a segment switch device may frequently be manufactured with less added process complexity than a with cell type that does not have a switch device. Examples include DRAM-type memory cells, FeRAM memory cells, and SONOS type EEPROM memory cells. Consequently, the invention is suitable for both volatile and non-volatile memory arrays.

There are many reasons for very high density memories to limit the length of the memory array sense lines. In DRAM arrays, it is desirable to limit the bit line capacitance. In FeRAM arrays, it is desirable to limit the capacitance of bit lines and the capacitance of the capacitor plate line. In diode-isolated matrix arrays, such as diode-antifuse (AF) memory arrays, it is desirable to reduce the number of reverse biased diode leakage paths. Each of these types of memory cells may be implemented into a memory array in accordance with one or more embodiments of the present invention to achieve an improved and more efficient 3D memory array.

In a broader context, the invention provides an integrated circuit including a three-dimensional memory array having a respective plurality of segmented array lines of a first type on each of at least one layer of the memory array, a plurality of global array lines on at least one layer of the memory array, and a respective plurality of segment switch devices on each of at least one layer of the memory array, each for coupling one or more segmented array lines of the first type to an associated global array line. The integrated circuit may include a plurality of shared vertical connections in the memory array, each providing a connection path for at least two segmented array lines of the first type, to an associated global array line. The shared vertical connections in the memory array may provide a connection path for at least one segmented array line of the first type on each of at least two layers, to an associated global array line.

In some embodiments, the invention provides a memory array having multiple layers of switches, multiple layers of segmented memory sense lines, and one or more layers of long array sense lines. In some embodiments vertical connections from the segmented lines to the global lines are shared by bit line segments on two or more layers, and/or may be shared by two or more bit line segments on each layer.

The invention in several aspects is suitable for integrated circuits having a memory array, for memory cell and memory array structures, for methods for operating such integrated circuits and memory arrays, for methods for forming or fabricating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 7 is a schematic diagram representing a bit line layer within an exemplary three-dimensional memory array, illustrating non-interleaved bit line segments which do not share vertical connections with any other bit line segments on the same bit line layer.

FIG. 8 is a schematic diagram representing a bit line layer within an exemplary three-dimensional memory array, illustrating 2:1 interleaved bit line segments, with a bit line segment from each of two adjacent blocks sharing a vertical connection to an associated global bit line residing on a different layer, to achieve a global bit line pitch that is twice the pitch of the bit line segments.

The use of the same reference symbols in different drawings indicates similar or identical items.

DETAILED DESCRIPTION

Figure 1:
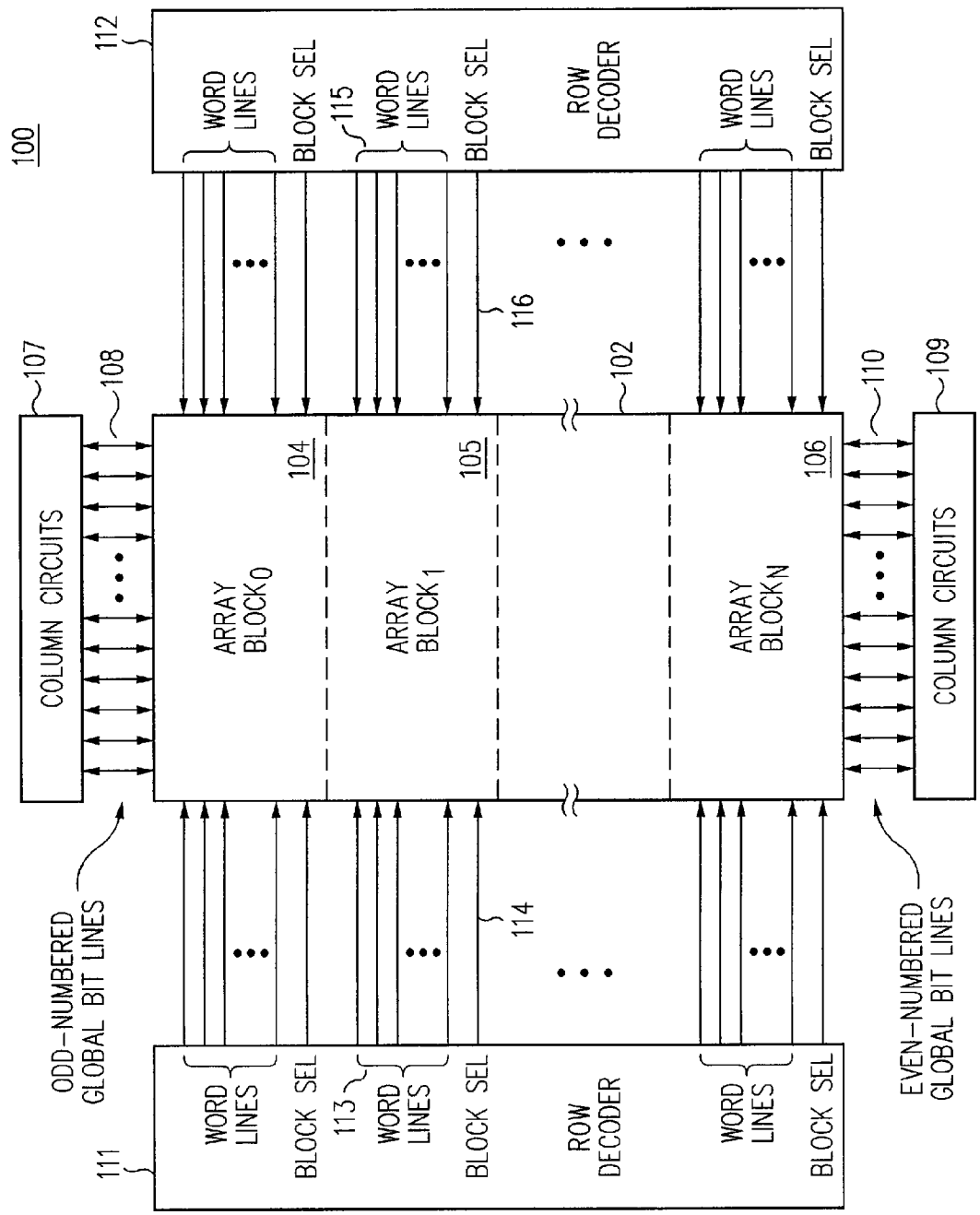
FIG. 1 is a block diagram of a three-dimensional memory array having at least two memory planes, each defining multiple memory blocks having segmented sense lines, in accordance with the present invention.

Referring now to FIG. 1, a block diagram is depicted of an exemplary memory array organization 100 including a memory array 102 having a plurality of array blocks 104, 105, ... 106. Half of the word lines for each array block are driven by a row decoder 111 to the left of the array 102, while the other half of the word lines for each array block are driven by a row decoder 112 to the right of the array 102. Using array block 105 as an example, a group of word lines 113 is provided by the row decoder 111 (which may represent the even-numbered word lines), while a second group of word lines 115 is provided by the row decoder 112 (which may represent the odd-numbered word lines). The row decoder 111 also provides one or more block select signals 114 to the array block 105, while the row decoder 112 also provides one or more block select signals 116 to the array block 105.

The memory array 102 includes a plurality of global bit lines, described further below. Half of the global bit lines (e.g., the odd-numbered global bit lines labeled 108) are driven and/or sensed by a column circuits block 107 at the top of the array 102, while the other half of the global bit lines (e.g., the even-numbered global bit lines labeled 110) are driven and/or sensed by a column circuits block 109 at the bottom of the array 102.

Figure 2:
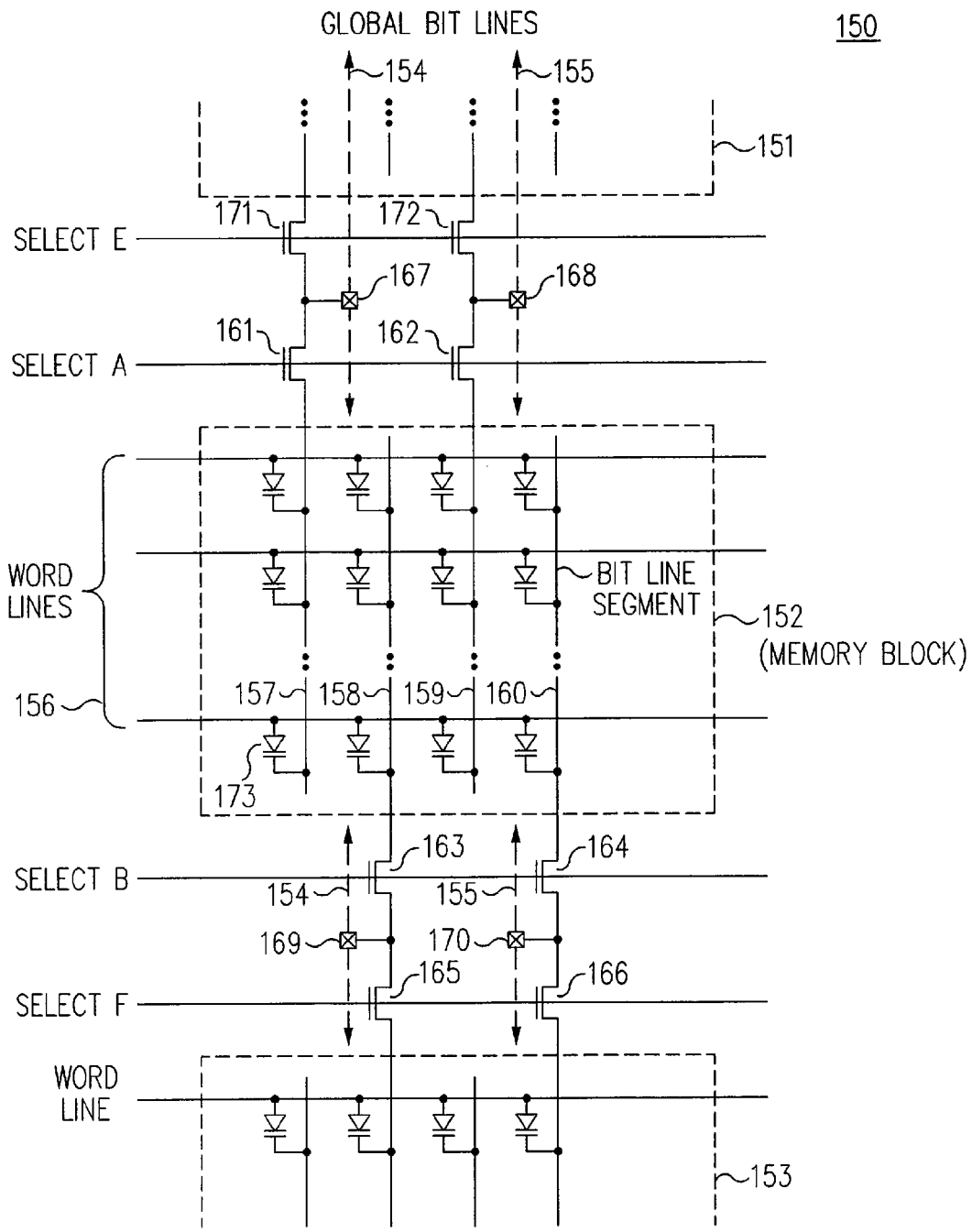
FIG. 2 is a schematic diagram representing a memory plane within an exemplary three-dimensional passive element memory array in accordance with some embodiments of the present invention, illustrating 2:1 interleaved bit line segments, with a bit line segment from each of two adjacent blocks sharing a vertical connection to an associated global bit line residing on a different layer, to achieve a global bit line pitch that is twice the pitch of the bit line segments.

Referring now to FIG. 2, a schematic diagram is depicted which represents a memory plane within an exemplary three-dimensional passive element memory array. One such memory plane 150 is shown, although preferably other memory planes are similarly arranged, as described in greater detail herebelow. The memory plane 150 includes a plurality of blocks, such as blocks 151, 152, and 153. Each block includes a plurality of word lines, such as word lines 156 associated with block 152. Each block also includes a plurality of bit line segments, such as bit line segments 157, 158, 159, and 160 associated with block 152. As indicated, a memory cell (e.g., memory cell 173) is formed between each word line and each bit line segment within a block.

Each bit line segment may be coupled to an associated global bit line by a segment switch device which is controlled by a block select signal. For example, bit line segment 157 is coupled by a segment switch device 161 to global bit line 154, which preferably resides on a different layer of the memory array. The connection path to the global bit line is formed by way of a vertical connection 167, which is shared by other memory planes, to provide a path for a bit line segment from any of at least two memory planes to be coupled to the global bit line.

The bit line segments of memory plane 150 are arranged in a 2:1 interleaved configuration, which allows the required pitch of the global bit lines to be twice that of the bit line segments. In this particular interleave arrangement half of the bit line segments within a block exit to the top of the block and are coupled under control of a SELECT-A control signal to the respective global bit lines, while the other half of the bit line segments exit to the bottom of the block and are coupled under control of a SELECT-B control signal to the same respective global bit lines. In particular, bit line segment 158 is coupled by segment switch device 163 to a shared vertical connection 169 to global bit line 154, bit line segment 159 is coupled by segment switch device 162 to a shared vertical connection 168 to global bit line 155, and bit line segment 160 is coupled by segment switch device 164 to a shared vertical connection 170 to global bit line 155.

In this exemplary configuration each of the shared vertical connections (which are shared vertically with other memory planes) is also shared by a bit line segment in an adjacent memory block within the same memory plane. For example, a bit line segment in block 151 (unlabeled) is coupled by segment switch device 171 (under control of a block select signal SELECT-E) to the same shared vertical connection 167, and consequently to global bit line 154. In other words, a bit line segment from each of two adjacent blocks shares a vertical connection to an associated global bit line, to achieve a global bit line pitch that is twice the pitch of the bit line segments. In particular another bit line segment in block 151 (unlabeled) is coupled by segment switch device 172 (controlled by SELECT-E) to the shared vertical connection 168, and consequently to global bit line 155. As described below, other interleave arrangements are also contemplated. Likewise bit line segments from memory block 153 are respectively coupled by segment switch devices 165, 166 to shared vertical connections 169, 170 and consequently to global bit lines 154, 155.

In this embodiment each global bit line is operably coupled to a respective bit line segment in a selected block of a selected memory plane by driving one of the two block select control signals associated with the selected block to an active state, while leaving the other block select control signal of the selected block, and all other blocks (both on the same memory plane and on other memory planes sharing the same global bit lines), at an inactive level. In a read operation, the signal from a memory cell is coupled from the bit line segment to a global bit line, and subsequently to sensing circuitry. In a write operation, the programming voltages and currents are conveyed from write driver circuitry, through the global bit line, through the segment switch device to the bit line segment, and coupled thereby to the selected memory cell.

Figure 3A:
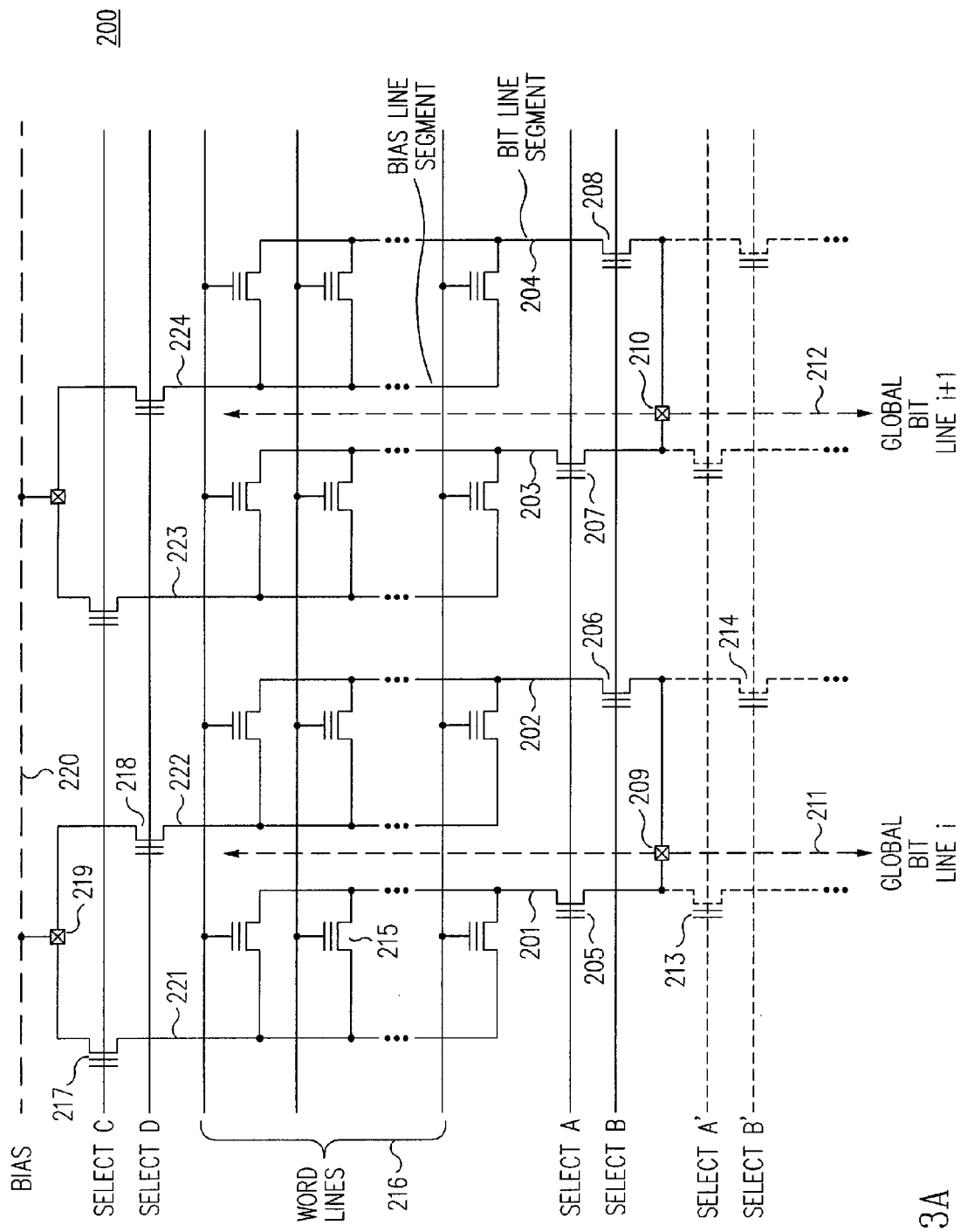
FIG. 3A is a schematic diagram representing a memory plane within an exemplary three-dimensional NOR EEPROM memory array, illustrating 2:1 interleaved bit line segments and bias line segments, with two laterally adjacent bit line segments sharing a vertical connection to an associated global bit line residing on a different layer, in accordance with an embodiment of the present invention.

Referring now to FIG. 3A, a schematic diagram is depicted which represents a memory plane within an exemplary three-dimensional NOR EEPROM memory array. Again, only one such memory plane 200 is shown, although preferably other memory planes are similarly arranged and share the vertical connections to global bit lines. The memory plane 200 includes a plurality of blocks, although only one such block is fully depicted (with select devices for another block drawn in dashed lines). Each block includes a plurality of word lines, such as word lines 216, and also includes a plurality of bit line segments, such as bit line segments 201, 202, 203, and 204. Each block also includes a plurality of bias line segments, such as bias line segments 221, 222, 223, and 224. As indicated, a memory cell (e.g., memory cell 215) is formed between a bit line segment and a bias line segment within a block, and is controlled by a word line within the block. Such three-terminal memory cells may be viewed as including a switch device, and may advantageously include a device having a charge storage dielectric, such as a SONOS (silicon-oxide-nitride-oxide-silicon) device. As used herein, such SONOS devices may include those having an oxynitride layer rather than, or in addition to, a nitride layer.

Each bit line segment may be coupled to an associated global bit line by a segment switch device which is controlled by an associated block select signal. For example, bit line segment 201 is coupled by a segment switch device 205 (controlled by a SELECT-A block select signal) to global bit line 211, which preferably resides on a different layer of the memory array. The connection path to the global bit line is formed by way of a vertical connection 209, which is shared by other memory planes, to provide a path for a bit line segment from any of at least two memory planes to be coupled to the associated global bit line.

The bit line segments of memory plane 200 are arranged in a 2:1 interleaved configuration, which again allows the required pitch of the global bit lines to be twice that of the bit line segments. In this particular interleave arrangement, adjacent bit line segments within a block share the same vertical connection to a global bit line but are controlled by different block select signals. Specifically, bit line segment 202 is coupled by segment switch device 206 (controlled by a SELECT-B block select signal) to global bit line 211, while bit line segment 203 is coupled by segment switch device 207 (controlled by SELECT-A) to global bit line 212, and bit line segment 204 is coupled by segment switch device 208 (controlled by SELECT-B) similarly to global bit line 212.

Referring to the bottom of FIG. 3A, the vertical connections may also be shared by an adjacent block. As indicated in dashed lines, segment switch device 213, which is controlled by a block select signal SELECT-A' (which is different from SELECT-A), couples a bit line segment from the adjacent memory block to the same vertical connection 209 to connect to the global bit line 211. Similarly, segment switch device 214 (controlled by a block select signal SELECT-B') couples another bit line segment from the adjacent memory block to the same vertical connection 209 to connect to the global bit line 211. In such a configuration, each vertical connection to an associated global bit line is shared by two laterally adjacent bit line segments within each of two adjacent memory blocks within a bit line layer. Such vertical connections are also preferably shared by similar structures on one or more additional bit line layers of the array.

Referring to the top of FIG. 3A, each of the bias line segments within the block is coupled by one of two bias line select signals associated with the block to a bias node for the block. Specifically, bias line segment 221 is coupled by segment switch device 217 (controlled by SELECT-C) to a common bias line 220, while bias line segment 222 is coupled by segment switch device 218 (controlled by SELECT-D) to the same bias line 220, both by way of a shared vertical connection 219. In some embodiments, the vertical connection 219 (and consequently the bias line 220) may be shared by an adjacent block (not shown). The bias line 220 is preferably routed on an interconnect layer above the memory cells, and traverses parallel to the word lines.

Figure 3B:
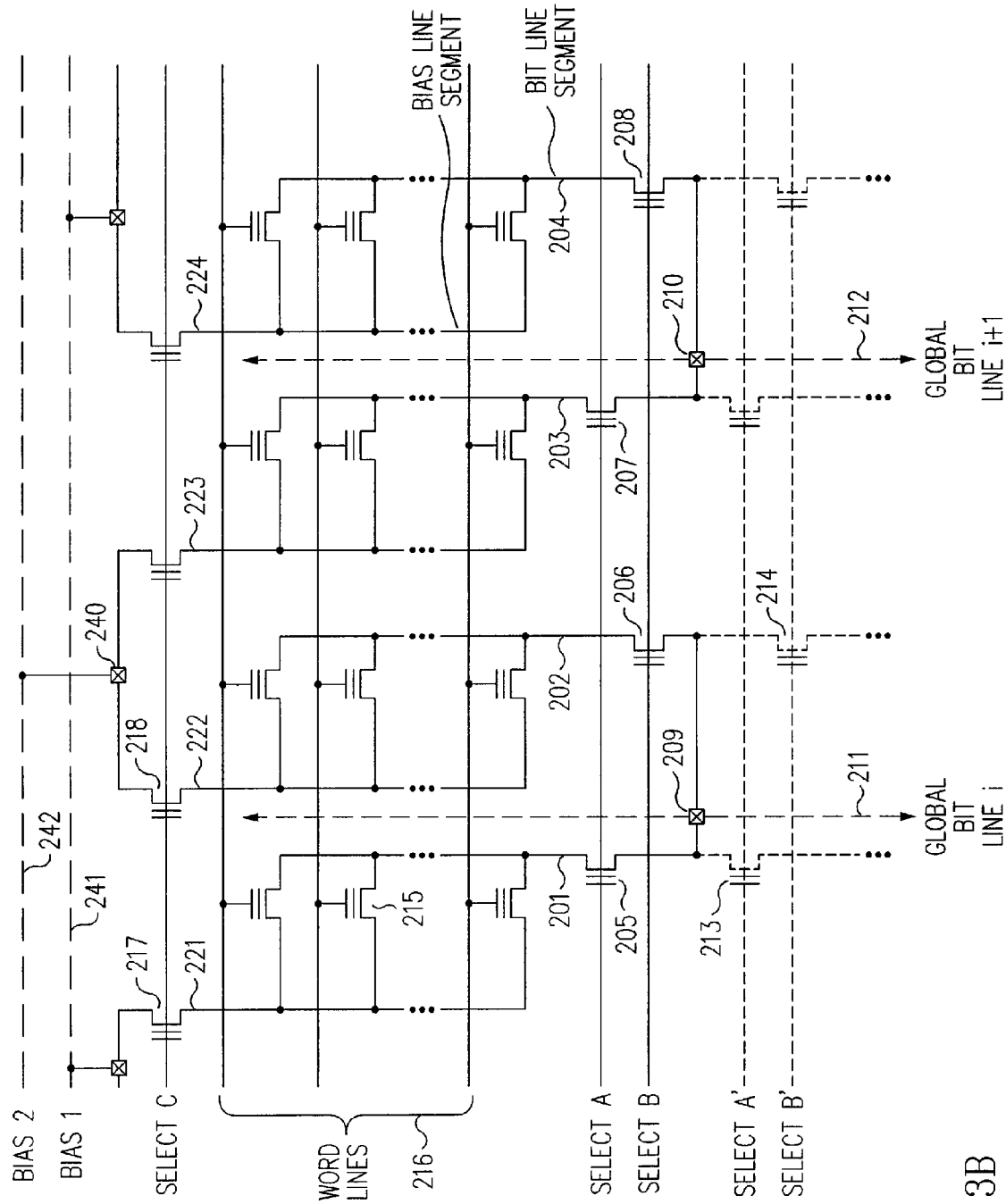
FIG. 3B is a schematic diagram representing a memory plane within an exemplary three-dimensional NOR EEPROM memory array, illustrating 2:1 interleaved bit line segments and bias line segments, with laterally adjacent bias line segments sharing a vertical connection to an associated one of a pair of global bias lines, in accordance with an embodiment of the present invention.

In another embodiment, shown in FIG. 3B, the SELECT-C signal is connected to both device 217 and 218 but two different bias lines are provided. The arrangement of vertical connections to global bias lines and global bit lines is such that memory segments such as 221 and 222 that share a global bit line 211 do not share the same global bias line but rather are connected to bias line 241 and 242, respectively. Shared vertical connections, such as 240, for the connection to global bias lines may still be used to save area.

In some embodiments, each block may contain 128 word lines, and consequently there are 128 memory cells coupled to each bit line segment which together form a NOR group of memory cells. The bit line segments may also be viewed as a segmented sense line or common source line of the memory cells of the block. Within a block, there are many groups of 128 SONOS devices (alternatively, floating gate devices) that all share the 128 word lines (e.g., word lines 216) that form the gates of the SONOS devices, although in FIG. 3A only four such groups are shown. In the bit line direction, while two memory blocks are suggested by FIG. 3A, in practice it is anticipated that many such memory blocks would be present on each memory plane and share the same global bit lines. A number of memory planes are also contemplated, each sharing the same vertical connections to the global bit lines. For example, eight memory planes (i.e., memory layers) is particularly advantageous, although other numbers, both greater and less than eight are also contemplated. While numbers of memory planes which are integral powers of two may be convenient for decoder efficiency, such is not necessarily required.

The segment switch devices (both for the bit line segments and bias line segment s) may be implemented as any of a variety of switch devices, such as MOS transistors, which may be N-channel, P-channel, enhancement mode or depletion mode, but are preferably implemented as a single device with the same structure as the SONOS memory cell devices. The width and length of the segment switch devices are not necessarily the same as the cell device. In some embodiments the device may be about twice as wide as the cell device so the resistance of the device is smaller than the cell and has a minimal effect on the sensing operations.

If implemented as a SONOS device, the threshold voltage ($V_T$) of the segment switch device (e.g., device 205) can change during memory operation, particularly during program operations. Consequently, the segment switch device is preferably periodically biased in a suitable manner to periodically reset the $V_T$ to the low (i.e., erased) state. In some embodiments it may be desirable to modify the switch device to prevent such unintentional programming from occurring.

For example, the semiconductor process may be altered to selectively remove the nitride region from the gate dielectric of the segment switch devices (but not the memory cell devices) before the transistor gate regions are formed. In an alternative embodiment, the segment switch is set to the high threshold value (i.e., programmed state) and the voltages applied to the various SELECT signals are high enough to pass the desired voltage and current.

In some embodiments having eight memory planes, the vertical connections to the global bit lines are shared by all eight memory planes. As shown in FIG. 3A, the vertical connections may also be shared by two adjacent NOR groups (i.e., shared by two adjacent bit line segments). By activating (i.e., selecting) either SELECT-A or SELECT-B one at a time, the individual bit line segments may be individually coupled to the global bit lines to either sense the segmented lines one at a time or write the segmented lines one at a time. The vertical connections may also be shared by an adjacent memory block, such as that selected by the SELECT-A' and SELECT-B' signals shown. This sharing reduces the number of vertical connections which take up valuable chip area, especially as the number of cells on the segment is frequently limited by program disturb characteristics and by the desired erase block size to be in the range of 128 cells or less.

In some exemplary embodiments, a number of memory blocks, such as 64 such memory blocks, may be provided, which all share the same global bit lines. The vertical connections from the bit line segments (through the segment switch devices) to a global sense line may be shared between adjacent memory blocks, giving rise to, for example, 32 such vertical connections per global bit line. Each global bit line is also connected to sense circuitry and a write drive (i.e., programming) circuitry, and in some embodiments also to a set of cells used as a reference for sensing. Preferably the global bit lines traverse parallel to the segmented sense lines (i.e., bit line segments) on a wiring layer preferably below the memory cells for easy attachment to support circuits.

In operation each global bit line is coupled to a respective bit line segment in a selected block of a selected memory plane by driving one of the two block select control signals associated with the selected block to an active state, while leaving the other block select control signal of the selected block, and all the block select control signals of other blocks (both on the same memory plane and on other memory planes sharing the same global bit lines), at an inactive level. In a read operation the signal from a memory cell is coupled from the bit line segment to a global bit line, and subsequently to sensing circuitry. In a write (programming) mode of operation, the programming voltages and currents are conveyed from write driver circuitry, through the global bit line, through the segment switch device to the bit line segment, and coupled thereby to the selected memory cell.

In the programming mode the control signals SELECT-A and SELECT-B and the control signals SELECT-C and SELECT-D are coordinated so either a bit line segment select device (i.e., a bit line switch) or a bias line segment select device (i.e., a bias line switch) is on for each of the selected groups, but not both. The bias line 220 is preferably utilized to provide a write inhibit voltage to unselected cell groups, as is further described in U.S. patent application Ser. No. 10/325,737, filed Dec. 23, 2002, entitled "Array Containing Charge Storage and Dummy Transistors and Method of Operating the Array," which application is hereby incorporated by reference in its entirety. Some of the global bit lines preferably are biased to also provide a write inhibit voltage to other memory cell groups that are not being programmed. In a read mode of operation the SELECT-A, SELECT-B, SELECT-C, and SELECT-D control signals are coordinated so that a suitable bias is supplied to the bias line side of a selected memory cell, and the bit line segment (sense line) switch device is turned on for sensing.

Figure 4:
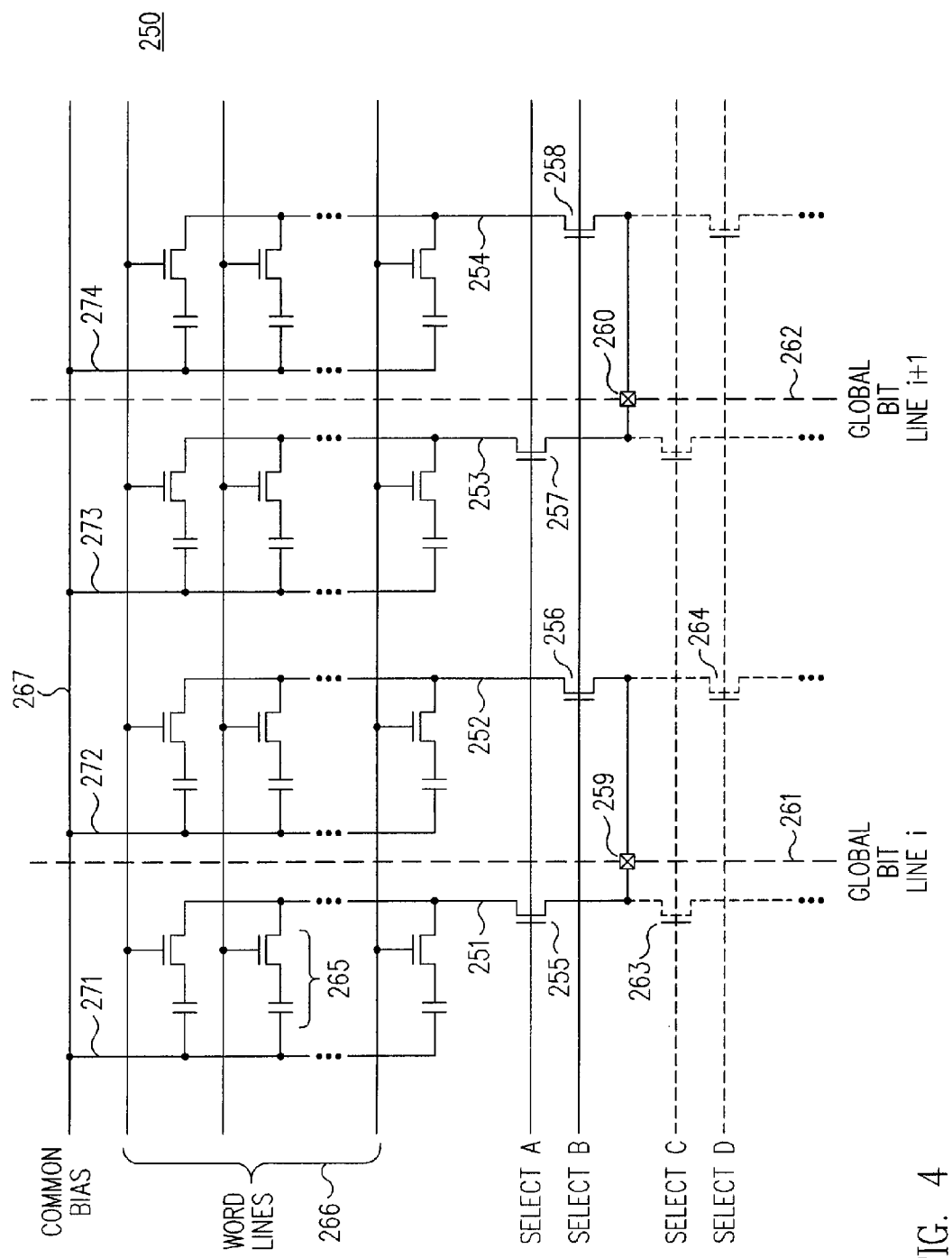
FIG. 4 is a schematic diagram representing a memory plane within an exemplary three-dimensional DRAM memory array, illustrating 2:1 interleaved bit line segments and a common bias line, with two laterally adjacent bit line segments sharing a vertical connection to an associated global bit line residing on a different layer, in accordance with an embodiment of the present invention.

The invention may also be applied to dynamic random access memory arrays (DRAM arrays) in which memory cell state is stored as a charge level on a capacitor. FIG. 4 is a schematic diagram representing a memory plane within an exemplary three-dimensional DRAM memory array. Only one such memory plane 250 is shown, although preferably other memory planes are similarly arranged and share the vertical connections to global bit lines. The memory plane 250 includes a plurality of blocks, although only one such block is fully depicted (with select devices for another block drawn in dashed lines). Each block includes a plurality of word lines, such as word lines 266 and also includes a plurality of bit line segments, such as bit line segments 251, 252, 253, and 254. Each block also includes a plurality of bias line segments, such as bias line segments 271, 272, 273, and 274, which are connected to a common bias line 267. As indicated, a memory cell (e.g., memory cell 265) is formed between a bit line segment and a bias line segment within a block, and is controlled by a world line within the block. Such three-terminal memory cells may be viewed as including a switch device, and may be formed in a variety of suitable configurations, but preferably include an enhancement mode NMOS select device in series with a dielectric capacitor. Such dielectrics may include silicon oxides, silicon oxy-nitrides, tantalum oxides, and other desirable high permittivity dielectrics.

In the exemplary embodiment shown, each bit line segment is coupled to an associated global bit line by a segment switch device which is controlled by an associated block select signal. For example, bit line segment 251 is coupled by a segment switch device 255 (controlled by a SELECT-A block select signal) to global bit line 261, which resides on a different layer of the memory array. The connection path to the global bit line is formed by way of a vertical connection 259, which is shared by other memory planes, to provide a path for a bit line segment from any of at least two memory planes to be coupled to the associated global bit line.

The bit line segments of memory plane 250 are arranged in a 2:1 interleaved configuration, which provides for the global bit line pitch to be twice that of the bit line pitch. In this particular interleave arrangement adjacent bit line segments within a block share the same vertical connection to a global bit line but are controlled by different block select signals. Specifically, bit line segment 252 is coupled by segment switch device 256 (controlled by a SELECT-B block select signal) to global bit line 261. Moreover, bit line segment 253 is coupled by segment switch device 257 (controlled by SELECT-A) to global bit line 262, and bit line segment 254 is coupled by segment switch device 258 (controlled by SELECT-B) similarly to global bit line 262, both by way of a shared vertical connection 260.

The shared vertical connections may also be shared by an adjacent block within the same memory plane. As indicated in dashed lines, segment switch device 263, controlled by a block select signal SELECT-C, couples a bit line segment from the adjacent memory block to the same vertical connection 259 to connect to the global bit line 261. Similarly, segment switch device 264, controlled by a block select signal SELECT-D, couples another bit line segment from the adjacent memory block to the same vertical connection 259 to connect to the global bit line 261. In such a configuration, each vertical connection to an associated global bit line is shared by two laterally adjacent bit line segments within each of two adjacent memory blocks within a bit line layer. Such vertical connections are also preferably shared by similar structures on one or more additional bit line layers of the array.

Each of the bias line segments within the block is connected to a common bias line 267, which is preferably routed parallel to the word lines on an interconnect layer above the memory cells, and may be shared with an adjacent memory block on the same memory plane, as well as shared by other memory planes through one or more vertical connections (not shown).

The number of memory cells per bit line segment may be determined by the capacitance of the bit line segment compared to the global bit line. In some embodiments, 128 such memory cells may be associated with each bit line segment. The bit line segment switch devices (e.g., device 255) may be implemented as any of a variety of switch devices, such as MOS transistors, which may be N-channel, P-channel, enhancement mode or depletion mode, but are preferably implemented as a single device with the same or similar structure as the memory cell select devices. However, the width and length of the segment switch devices are not necessarily the same as the memory cell select device.

DRAM memory cells are destructively read, as is well known, and must be refreshed after being read. To read one or more memory cells with the memory block depicted, one of the word lines 266 is driven to an active level, which transfers charge from the associated memory cells to both bit line segments 251 and 252. By first activating only one of the SELECT-A or SELECT-B control signals, one of the two bit line segments is coupled to the global bit line and may be sensed, then the global bit line is biased again at a suitable read level, and the other SELECT-A or SELECT-B control signal is then activated to couple the other bit line segment to the global bit line for sensing. The SELECT-C and SELECT-D control signals remain inactive during such a read operation for the memory block shown, as do the associated control signals for all other blocks (both on the same memory plane and on other memory planes sharing the same global bit lines).

To write such a memory cell, the global bit line is driven to a first data level for the first bit line segment sharing the global bit line, and the appropriate SELECT control signal is pulsed to write the data onto the first bit line segment (and into the selected memory cell), then the global bit line is driven to a second data level for the second bit line segment sharing the global bit line, and the other SELECT control signal is pulsed to write the data onto the second bit line segment. With both bit line segments driven to the associated data state, the selected word line may then be inactivated to complete the write into the memory cells associated with the selected word line.

Figure 5:
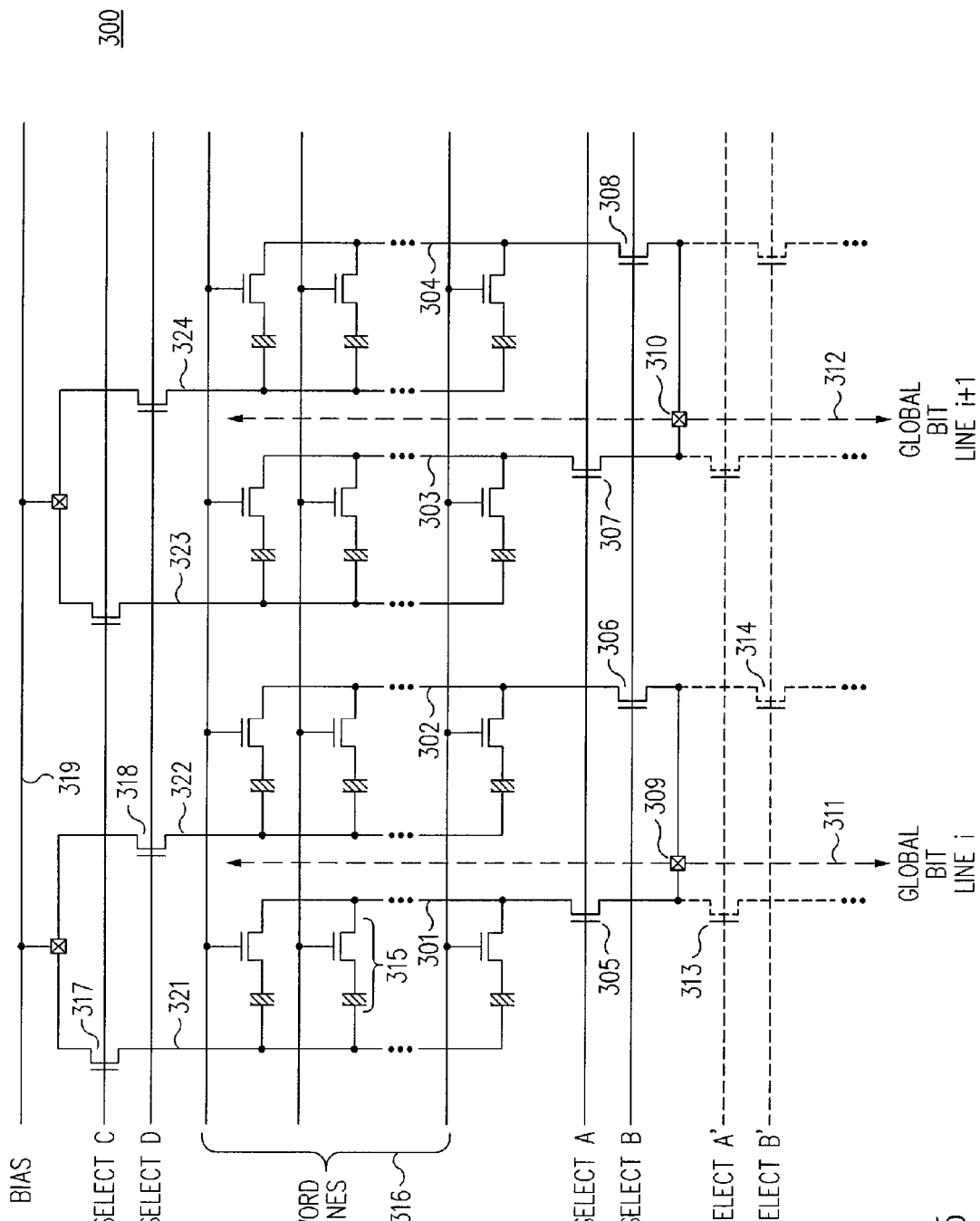
FIG. 5 is a schematic diagram representing a memory plane within an exemplary three-dimensional FeRAM memory array, illustrating 2:1 interleaved bit line segments and a pair of bias lines, with two laterally adjacent bit line segments sharing a vertical connection to an associated global bit line residing on a different layer, in accordance with an embodiment of the present invention.

Referring now to FIG. 5, a schematic diagram is depicted which represents a memory plane 300 within an exemplary three-dimensional FeRAM memory array, although preferably other memory planes are similarly arranged and share the vertical connections to global bit lines. The memory plane 300 includes a plurality of blocks, although only one such block is fully depicted (with select devices for another block drawn in dashed lines). Each block includes a plurality of word lines, such as word lines 316 and also includes a plurality of bit line segments, such as bit line segments 301, 302, 303, and 304. Each block also includes a plurality of bias line segments, such as bias line segments 321, 322, 323, and 324. As indicated, a memory cell (e.g., memory cell 315) is formed between a bit line segment and a bias line segment within a block, and is controlled by a world line within the block. Such three-terminal memory cells may be viewed as including a switch device, and may advantageously include an N-channel enhancement-mode field effect transistor.

Each bit line segment may be coupled to an associated global bit line by a segment switch device which is controlled by an associated block select signal. The bit line segments of memory plane 300 are arranged in a 2:1 interleaved configuration, which again allows the required pitch of the global bit lines to be twice that of the bit line segments. In this particular interleave arrangement adjacent bit line segments within a block share the same vertical connection to a global bit line but are controlled by different block select signals. Specifically, bit line segments 301, 302 are respectively coupled by segment switch devices 305 (controlled by a SELECT-A) and 306 (controlled by SELECT-B), to the global bit line 311 by way of a shared vertical connection 309, which is shared by other memory planes and optionally shared with an adjacent memory block (e.g., segment switch devices 313, 314). Bit line segments 303, 304 are respectively coupled by segment switch devices 307 (controlled by SELECT-A) and 308 (controlled by SELECT-B) to a global bit line 312 by way of a shared vertical connection 310, which is shared by other memory planes.

Referring to the top of FIG. 5, each of the bias line segments within the block is coupled by one of two bias line select signals associated with the block to a corresponding one of two bias nodes for the block. Specifically, bias line segments 321, 322 are respectively coupled by segment switch devices 317 (controlled by SELECT-C), 318 (controlled by SELECT-D) to a bias line 319, which is preferably routed on an interconnect layer above the memory cells and traverse parallel to the word lines. In some embodiments, the bias line 319 may be shared by an adjacent block (not shown).

Memory blocks may be configured with a number of word lines, such as 128 word lines, and many such memory blocks would preferably be present on each memory plane and share the same global bit lines. A number of memory planes are also contemplated, each sharing the same vertical connections to the global bit lines. A number of memory planes may be provided, such as eight memory planes.

The segment switch devices (both for the bit line segments and bias line segments) may be implemented as any of a variety of switch devices, such as MOS transistors, which may be N-channel, P-channel, enhancement mode or depletion mode, but are preferably implemented as a single device with the same structure as the memory cell switch devices. The width and length of the segment switch devices are not necessarily the same as the cell device. In some embodiments the device may be about twice as wide as the cell device so the resistance of the device is smaller than the cell and has a minimal effect on the sensing operations.

As shown in FIG. 5, the vertical connections may be shared by two adjacent NOR groups (i.e., shared by two adjacent bit line segments which share the same word lines). By activating (i.e., selecting) either SELECT-A or SELECT-B one at a time, the individual bit line segments may be individually coupled to the global bit lines to either sense the segmented lines one at a time or write the segmented lines one at a time. The vertical connections may also be shared by an adjacent memory block, such as that selected by the SELECT-A' and SELECT-B' signals shown.

In a read mode of operation the SELECT-A, SELECT-B, SELECT-C, and SELECT-D control signals are coordinated so that a suitable bias is supplied to the bias line side of a selected memory cell, and the bit line segment (sense line) switch device is turned on for sensing. In a write mode of operation the cell device in cell 315 is turned on and SELECT-A and SELECT-C are at an active level to apply a voltage across the ferro-electric capacitor in the cell that is sufficient to polarize the ferro-electric material. In a destructive read mode of operation, the cell 315 is read by sensing the current produced by a reversing of the polarization in the ferro-electric material in cell 315. During this sensing the cell device is turned on and SELECT-C and SELECT-A are at the active level, and a voltage pulse is applied from the global bias line BIAS1 through device 317 to the segmented bias line 321 while sensing global bit line 311. The SELECT-B and SELECT-D control signals are at an inactive level, devices 306 and 318 are off, and no memory cell on bit line segment 302 receives a bias pulse either from the bias line or due to voltage transients on the bit line. In alternative embodiments of the invention, known non-destructive read modes of operation of the FeRAM cell may be used.

Figure 6:
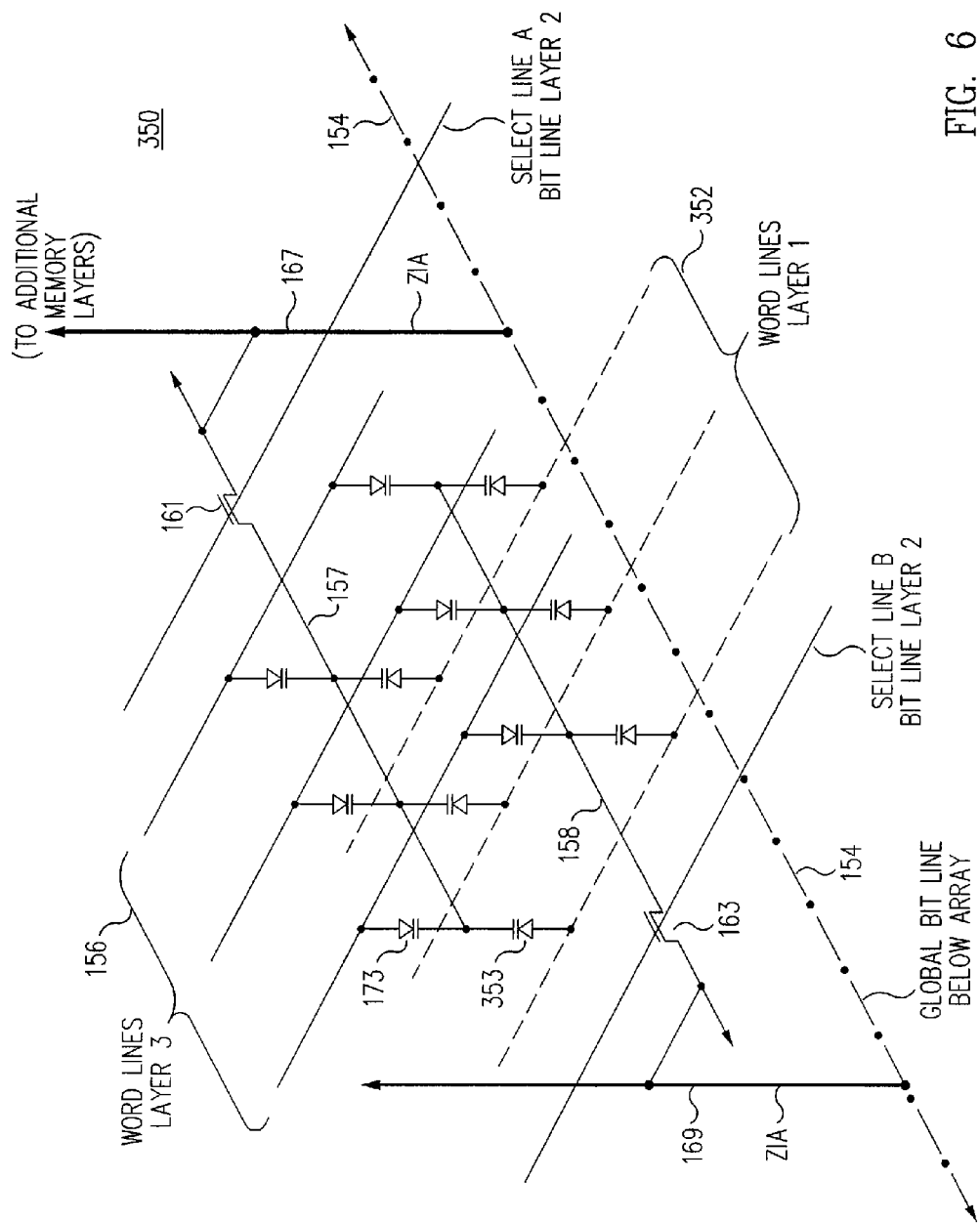
FIG. 6 is a perspective view of a multi-level array structure in accordance with an embodiment of the present invention, showing a half-mirrored memory array having bit line segments on a bit line layer shared with word lines on a layer below the bit line layer and also by word lines on a layer above the bit line layer.

FIG. 6 is a perspective view of a multi-level array structure in accordance with an embodiment of the present invention, showing a half-mirrored memory array having bit line segments on a bit line layer shared with word lines on a first word line layer below the bit line layer and also by word lines on a second word line layer above the bit line layer. The labeling of this figure generally corresponds to that shown in FIG. 2, assuming that the word lines 156 lie on a word line layer above the bit line layer containing bit line segments 157, 158, 159, and 160. In contrast to the structure depicted in FIG. 2, however, the structure shown in FIG. 6 includes a second word line layer which shares the same bit line layer. Word lines 352 on word line layer 1 and the bit lines 157, 158 of bit line layer 2 form another memory plane having a plurality of memory cells, such as memory cell 353, each formed between an associated one of the word lines 352 and an associated on of the bit line segments on bit line layer 2.

The vertical connections 167, 169 provide for a connection path from the segment switch devices 161, 163 (i.e., block select devices) within bit line layer 2 to an associated global bit line 154. In embodiments having more than two such memory planes, these vertical connections 167, 169 may provide a connection to additional bit line layers, as well. Such vertical connections may be formed using one or more vias through the various layers of the integrated circuit, and may use vias having some degree of offset for successive vias, preferably the vertical connections are formed using substantially aligned or coincident via structures to reduce the total area consumed by such connections. This configuration represents bit line segments which are 2:1 interleaved, and thus allows a more relaxed global bit line pitch relative to the pitch of the bit line segments.

A wide variety of array configurations are contemplated for use with this invention. In FIG. 7, a schematic diagram is depicted representing a bit line layer within an exemplary three-dimensional memory array 400, illustrating non-interleaved bit line segments which do not share vertical connections with any other bit line segments on the same bit line layer. In array block 401, a bit line segment 404 is coupled by segment switch device 403 to a vertical connection 405, which is connected to global bit line 406. In the adjacent array block 402, a bit line segment 407 is coupled by segment switch device 408 to a vertical connection 409, which is also connected to global bit line 406. The pitch of the global bit lines is identical to that of the bit line segments, and the pitch of the vertical connections is also identical to that of the bit line segments. A single block select signal (e.g., SELECT-A, SELECT-B) is provided for each array block.

FIG. 8 is a schematic diagram representing a bit line layer within an exemplary three-dimensional memory array 430, illustrating 2:1 interleaved bit line segments, with a bit line segment from each of two adjacent blocks (i.e., opposing bit line segments) sharing a vertical connection to an associated global bit line, to achieve a global bit line pitch that is twice the pitch of the bit line segments. In array block 432, a bit line segment 434 is coupled by segment switch device 439 to a vertical connection 440, which is connected to global bit line 441. The adjacent bit line segment 435 is coupled by segment switch device 436 to a vertical connection 437, which is also connected to the same global bit line 441. The vertical connection 440 is also shared by a bit line segment within the adjacent array block 431, while the vertical connection 437 is also shared by a bit line segment within adjacent array block 433 by way of segment switch device 438. The pitch of global bit lines 441, 442 is twice that of the bit line segments 434, 435. Moreover, the pitch of the vertical connections (e.g., vertical connections 440, 443) is also twice that required by the structure of FIG. 7. A pair of block select signals is provided for each array block (e.g., SELECT-B, SELECT-C for block 432).

Figures 9, 10:
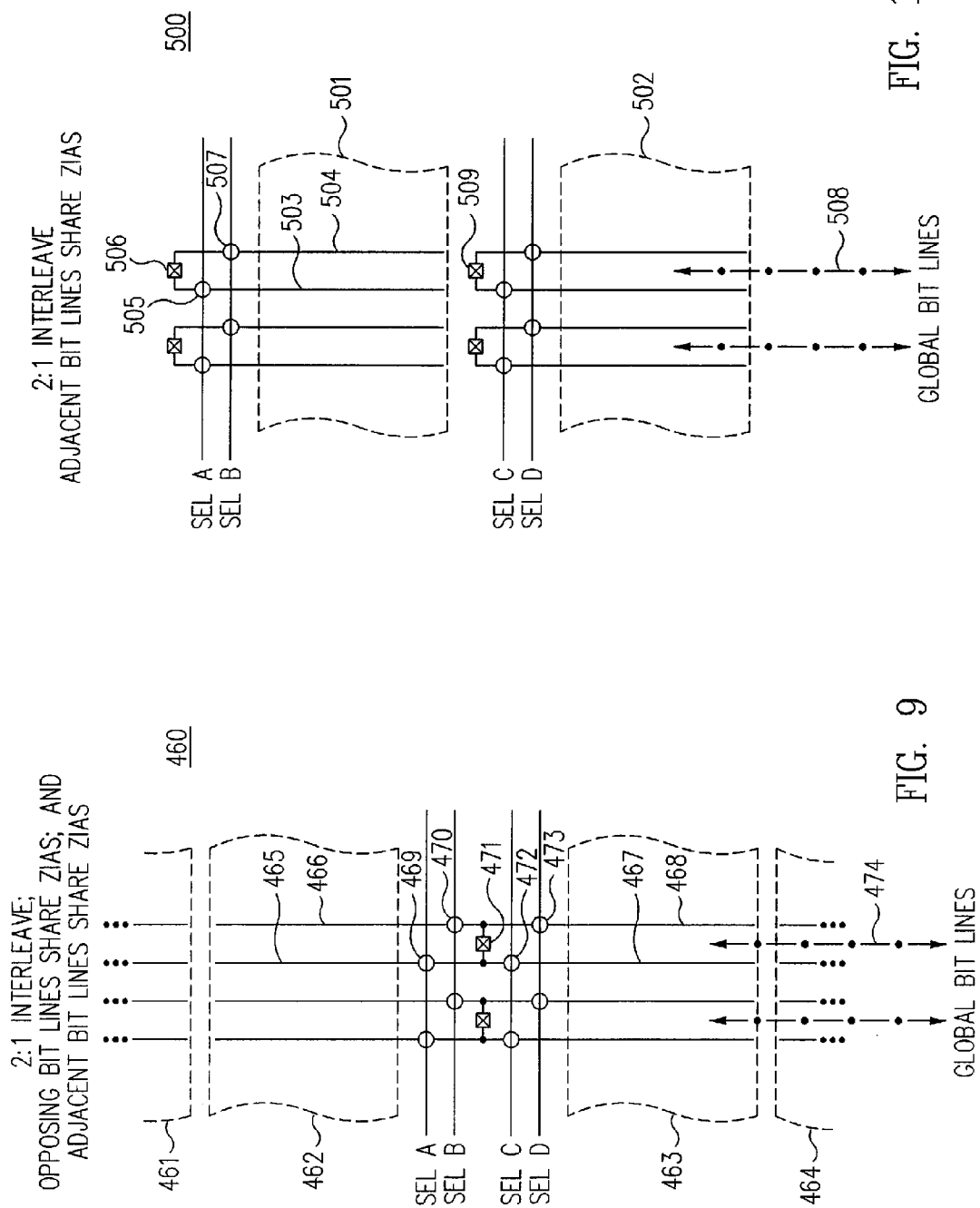
FIG. 9 is a schematic diagram representing a bit line layer within an exemplary three-dimensional memory array, illustrating 2:1 interleaved bit line segments, with two laterally adjacent bit line segments within the same block sharing a vertical connection to a global bit line with two laterally adjacent bit line segments within an adjacent block.
FIG. 10 is a schematic diagram representing a bit line layer within an exemplary three-dimensional memory array, illustrating 2:1 interleaved bit line segments, with two laterally adjacent bit line segments within the same block sharing a vertical connection to a global bit line.

FIG. 9 is a schematic diagram representing a bit line layer within an exemplary three-dimensional memory array, illustrating 2:1 interleaved bit line segments, with two laterally adjacent bit line segments within the same block sharing a vertical connection to a global bit line with two laterally adjacent bit line segments within an adjacent block. In array block 462, a bit line segment 465 is coupled by segment switch device 469 to a vertical connection 471, which is connected to global bit line 474. The adjacent bit line segment 466 is coupled by segment switch device 470 to the same vertical connection 471. In the adjacent array block 463, a bit line segment 467 is coupled by segment switch device 472 to the same vertical connection 471, and bit line segment 468 is coupled by segment switch device 473 to the same vertical connection 471. Each vertical connection is shared by a respective pair of adjacent bit line segments in each of two adjacent array blocks. The global bit line pitch is again twice the pitch of the bit line segments, as is the pitch of the vertical connections. Half as many vertical connections are needed relative to the structure of FIG. 8, as no vertical connections are provided between array blocks 461 and 462, and between array blocks 463 and 464. A pair of block select signals is provided for each array block (e.g., SELECT-A, SELECT-B for block 462), both disposed to one side of the array block.

FIG. 10 is a schematic diagram representing a bit line layer within an exemplary three-dimensional memory array, illustrating 2:1 interleaved bit line segments, with two laterally adjacent bit line segments within the same block sharing a vertical connection to a global bit line. In array block 501, a bit line segment 503 is coupled by segment switch device 505 to a vertical connection 506, which is connected to global bit line 508. An adjacent bit line segment 504 is coupled by segment switch device 507 to the same vertical connection 506. In the adjacent array block 502, a pair of bit line segments shares a vertical connection 509, which connects to the same global bit line 508. Each vertical connection is shared by a pair of adjacent bit line segments within an array block. The global bit line pitch (and the vertical connection pitch) is again twice the pitch of the bit line segments. A pair of block select signals is provided for each array block (e.g., SELECT-A, SELECT-B for block 501), both disposed to one side of the array block.

Figure 11:
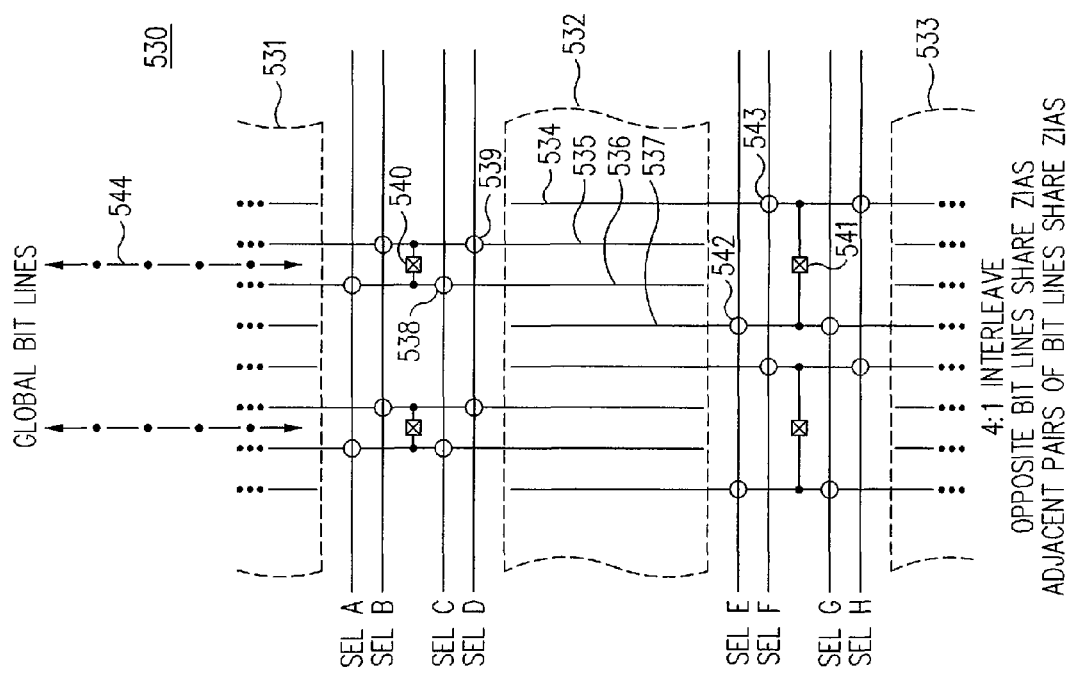
FIG. 11 is a schematic diagram representing a bit line layer within an exemplary three-dimensional memory array, illustrating 4:1 interleaved bit line segments, with two bit line segments within the same block sharing a vertical connection to a global bit line with two bit line segments within an adjacent block, to achieve a global bit line pitch that is one-fourth the pitch of the bit line segments.

FIG. 11 is a schematic diagram representing a bit line layer within an exemplary three-dimensional memory array, illustrating 4:1 interleaved bit line segments, with two bit line segments within the same block sharing a vertical connection to a global bit line with two bit line segments within an adjacent block, to achieve a global bit line pitch that is one-fourth the pitch of the bit line segments. In array block 532, a bit line segment 536 is coupled by segment switch device 538 to a vertical connection 540, which is connected to global bit line 544. An adjacent bit line segment 535 is coupled by segment switch device 539 to the same vertical connection 540. In adjacent array block 531, a pair of bit line segments are coupled through respective segment switch devices to the same vertical connection 540. Also in array block 532, a bit line segment 534 is coupled by segment switch device 543 to a vertical connection 541, which is similarly connected to global bit line 544. Another bit line segment 537 is coupled by segment switch device 542 to the same vertical connection 541. In adjacent array block 533, another pair of bit line segments are coupled through respective segment switch devices to the same vertical connection 541.

Each vertical connection is shared by a respective pair of adjacent bit line segments in each of two adjacent array blocks. But in this structure, the vertical connections are provided between each array block, allowing four bit line segments on the same bit line layer within a given array block to be associated with the same global bit line. The global bit line pitch is thus four times the pitch of the bit line segments, as is the pitch of the vertical connections. Since each vertical connection supports four bit line segments, no additional vertical connections are needed relative to the structure of FIG. 9, but the required global bit line has nonetheless been relaxed by another factor of two. A quad of block select signals is provided for each array block (e.g., SELECT-C, SELECT-D, SELECT-E, SELECT-F for block 532), disposed in pairs to each side of the array block.

Figure 12:
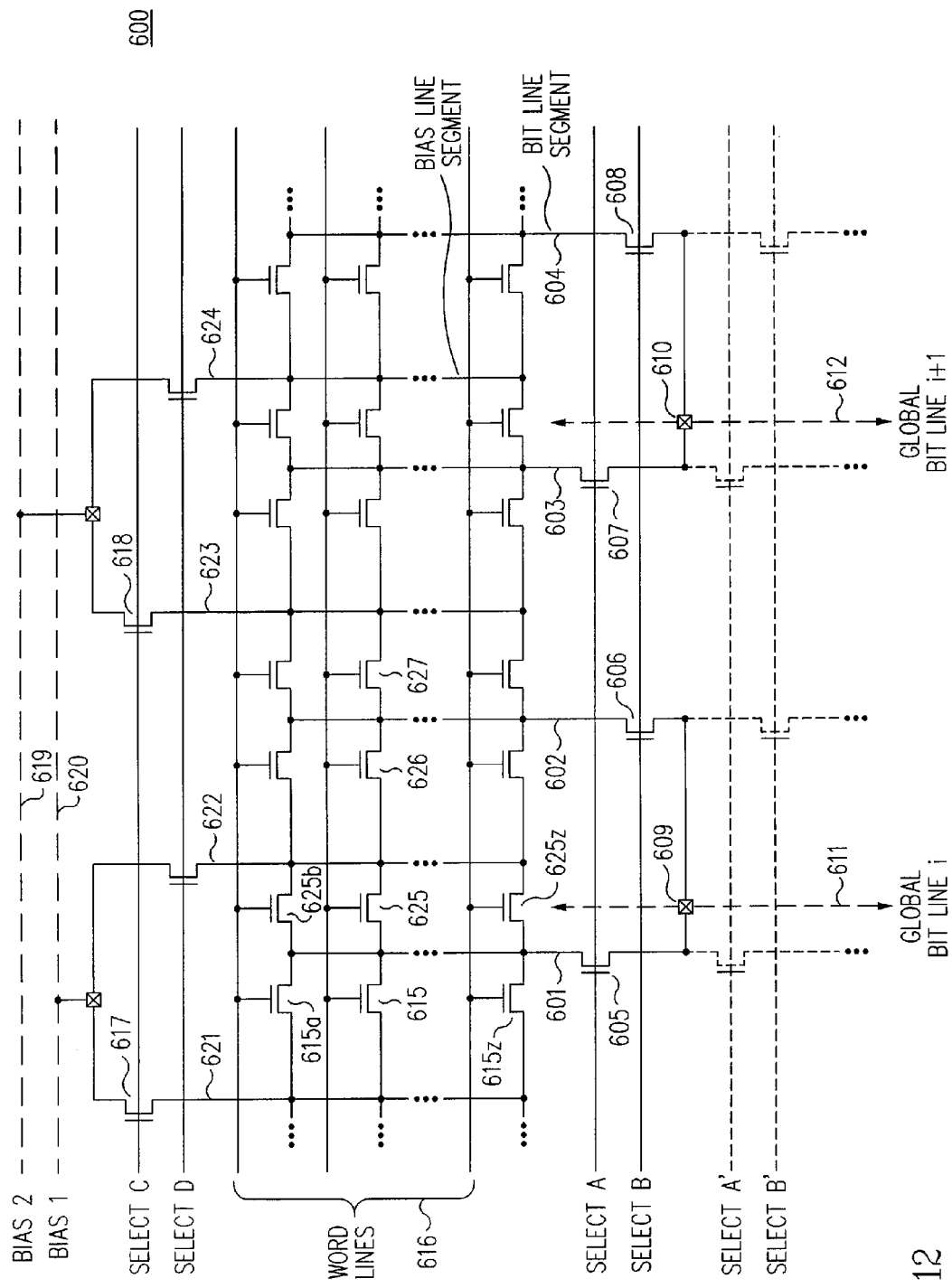
FIG. 12 is a schematic diagram representing a bit line layer within an exemplary three-dimensional ROM memory array, illustrating two memory segments associated with each bit line segment, and two laterally adjacent bias line segments sharing a vertical connection to one of two global bias lines residing on a different layer, in accordance with an embodiment of the present invention.

The invention may also be embodied as a read only memory (ROM) as shown in FIG. 12. The memory cell consists of a single device such as 615 in a layer 600 and other layers (not shown). The threshold of the memory cell device can be modified by any suitable technique known in the art of ROM arrays. A memory cell 615 is read by controlling the SELECT-A, SELECT-B, SELECT-C, and SELECT-D lines, and the BIAS1 line 620 and the BIAS2 line 619, while sensing the global bit line 611. Two memory segments, one including memory cells 615a, . . . 615, . . . 615z, and the other including memory cells 625a, . . . 625, . . . 625z, are associated with bit line segment 601. Memory cell devices exist at every intersection of a word line and a gap between bit line segments 601, 602, 603, and 604 and bias line segments 621, 622, 623, and 624. This arrangement forms a very dense matrix of memory cells in each memory layer and creates what could be called a cross-point device matrix of $4F^2$ cells. A conductive path through a memory cell 615 from BIAS1 line 620 to the global bit line 611 is established by raising SELECT-C and SELECT-A to their active level and raising the word line 616. By comparison, the path through memory cell 625 requires SELECT-D and SELECT-A to be active. While sensing memory cell 615, a potential sneak path through collective devices 618, 627, 626, and 625 to bit line segment 601 may exist. But this potential sneak path does not interfere with sensing if the BIAS2 line 619 is held at a voltage close to the voltage of the global bit line 611. Current mode sensing on global bit lines is preferred for this embodiment. The BIAS1 and BIAS2 lines are respectively coupled to alternating pairs of bias line segments. For example, BIAS1 is coupled to bias line segment 621 (by SELECT-C) and bias line segment 622 (by SELECT-D), whereas BIAS2 is coupled to bias line segment 623 (by SELECT-C) and bias line segment 624 (by SELECT-D). This embodiment is also envisioned with write-once memory cells.

As may be appreciated by the above-described examples, the present invention may be employed in a wide variety of embodiments. For example, the global bit lines may reside on a layer that is below all the memory layers (i.e., memory planes), above all the memory layers, or in the midst of the memory layers. Moreover, the global bit lines may reside on more than one layer. As one particular example, a first layer of global bit lines may be associated with some of the memory planes, and second layer of global bit lines may be associated with the remaining memory planes.

In certain embodiments, a memory cell is connected between an associated bit line segment and an associated word line. In other embodiments, each memory cell is also connected to an associated bias line segment. Such a bias line segment may include a bias segment switch device providing a connection to an associated bias line. Such bias lines preferably run perpendicular to the sensing lines (i.e., the global bit lines).

In embodiments having segment switch devices for one or both of the bit line segment and bias line segments, such segment switch devices may be formed by the same process steps as the array device. This both simplifies the process flow and may also result in a smaller layout, as the space between an array device and a segment switch device need not accommodate a mask tolerance to selectively process one differently than the other. In other embodiments, however, the segment switch device may be formed differently than the switch device (if present) within the memory cell, and so would have different characteristics than the memory cell switch device.

In various embodiments of the invention, a memory array may include passive element memory cells, DRAM-like memory cells, or FeRAM (Ferro-electric RAM) memory cells. Such memory cells may be formed on a segmented bit line (i.e., each memory cell coupled to an associated bit line segment) on one or more layers of a memory array.

In various embodiments, the vertical connections may connect to a single bit line segment on a layer, or may be shared by more than one bit line segment on a layer. For example, a respective bit line segment in each of two adjacent array blocks (i.e., they are associated with different word lines) may share the same vertical connection, because the respective segment switch devices (one in each array block) are controlled separately. Moreover, in another example, two (or more) bit line segments in the same array block (i.e., they are associated with the same word lines) may share the same vertical connection, because each respective bit line segment has a separately controlled segment switch device. Such sharing allows the global bit line pitch and vertical connection pitch to be at least twice the bit line segment pitch, which is particularly advantageous for small memory cells such as Flash EEPROM cells (e.g., floating gate or SONOS type) and passive element memory cells.

Figure 13:
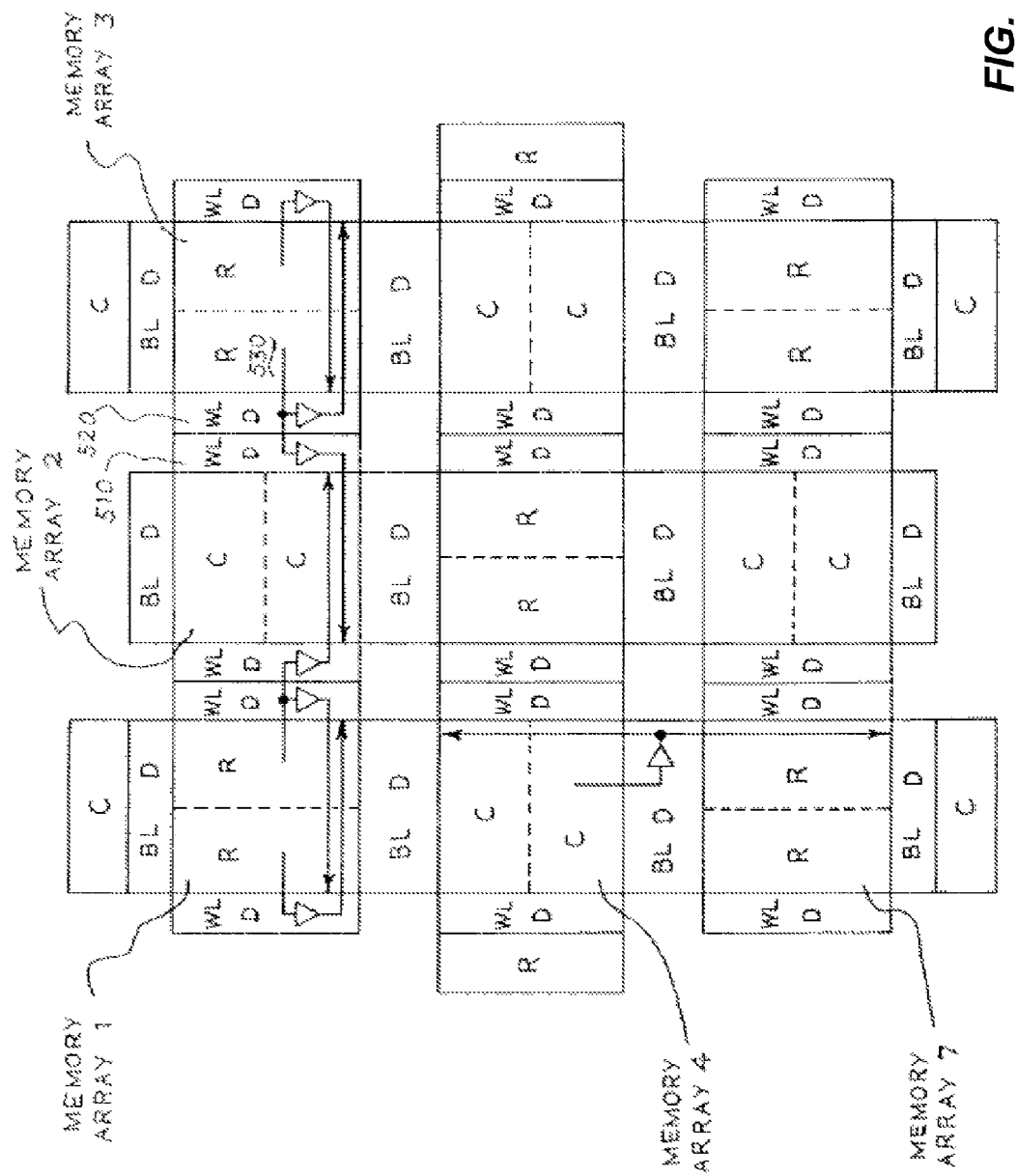
FIG. 13 depicts an exemplary memory circuit arrangement of a preferred embodiment, in which bit line circuitry for more than one memory sub-array is disposed under one of the sub-arrays.

In certain embodiments, a single layer of global bit lines is provided. This global bit line layer may be above, within, or below the memory planes, although providing the global bit line layer below the memory array allows more advantageous routing to bit line circuitry such as drivers and sense amplifiers. In other embodiments, two layers of global bit lines may be provided, such as one layer below the memory planes and the other layer above the memory planes. In one example, one bit line segment of an adjacent pair of bit line segments (i.e., sharing the same word lines) is associated with the first global bit line layer, and the second bit line segment of the adjacent pair is associated with the second global bit line layer, which allows an even larger global bit line pitch on each global bit line layer. Alternatively, the bit line circuitry can be located below some of the array blocks. The array blocks can be grouped into multiple sub-arrays. Preferably the bit line circuitry is located under only some of the sub-arrays in the manner of a checkerboard array, as described in U.S. patent application Ser. No. 09/896,814, filed Jun. 29, 2001, entitled "Memory Device With Row and Column Decoder Circuits Arranged in a Checkerboard Pattern Under a Plurality of Memory Arrays," which application is hereby incorporated by reference in its entirety. A checkerboard arrangement, one such example of which is shown in FIG. 13, is also envisioned for any of the embodiments described herein. The global bit lines may be extended to the edge of some of the sub-arrays to reach and share bit line circuitry placed under an adjacent sub-array. Circuitry that controls the word lines lies below the global bit lines in others of the sub-arrays.

In the memory structure shown in FIG. 13, there is one set of bit line drivers (BL D) between memory arrays (resulting in continuous bit lines across two adjacent memory arrays), but two sets of word line drivers (WL D) between memory arrays (resulting in word lines that are not continuous between two adjacent memory arrays). This is shown, for example, by the two word line drivers 510, 520 between memory arrays 2 and 3. One of the pair of row decoder circuits 530 under memory array 3 (also labeled as "R") drives both sets of word line drivers 510, 520. Word line drivers 510 activate word lines in memory array 2, while word line drivers 520 activate word lines in memory array 3. This breaking of a continuous word line into two word lines may be preferred if long, continuous word lines generate too much leakage current. In other embodiments, there may be two sets of bit line drivers between adjacent memory arrays (also described herein as array blocks and/or sub-arrays), as well as two sets of word line drivers between adjacent memory array blocks, so that neither bit lines nor word lines are continuous between adjacent memory array blocks. Such embodiments, and others (including those described in more detail in the aforementioned U.S. application Ser. No. 09/896,814), may include word line circuits (e.g., row decoder R labeled as 530) each shared by a respective pair of adjacent sub-arrays (e.g., memory arrays 2 and 3), but disposed substantially beneath only one of the pair of adjacent sub-arrays (e.g., memory array 3). Similarly, the word line circuits (e.g., row decoder R shown on the right side of memory array 1) is shared by adjacent sub-arrays (e.g., memory arrays 1 and 2), but disposed substantially beneath only one of the pair of adjacent sub-arrays (e.g., memory array 1). In addition, such embodiments (and others) may include bit line circuits (e.g., column decoder "C" as shown in the lower half of memory array 4) each shared by a respective pair of adjacent sub-arrays (e.g., memory arrays 4 and 7), but disposed substantially beneath only one of the pair of adjacent sub-arrays (e.g., memory array 4).

In certain embodiments, memory layers may be formed as a mirrored structure so that bit lines (i.e., bit line segments) and/or word lines are shared by more than one memory plane. For example, a half-mirrored memory array may include word lines within a word line layer which are shared by a first bit line layer disposed above the word line layer and by a second bit line layer disposed below the word line layer, with the first and second bit line layers not shared with other word line layers. Similarly, another exemplary half-mirrored memory array may include bit line segments within a bit line layer which are shared by a first word line layer disposed above the bit line layer and by a second word line layer disposed below the bit line layer, with the first and second word line layers not shared with other bit line layers.

In certain embodiments incorporating a half-mirrored array, two global bit line layers may be provided so that one memory layer is associated with the first global bit line layer, and another memory layer is associated with the second global bit line layer. For example, in a half-mirrored array having a word line layer shared by an upper bit line layer and a lower bit line layer, the upper bit line layer may be associated with the first global bit line layer while the lower bit line layer may be associated with the second global bit line layer. In a memory array having at least two word line layers and four bit line layers, a first set of bit line layers may be associated with the first global bit line layer, with a second set of bit line layers associated with the second global bit line layer. Generalizing somewhat, a half-mirrored memory array may include two sets of memory layers corresponding respectively to two global bit line layers.

In some embodiments, the segment switch devices may be implemented as diodes functioning as isolation devices. If the bias voltage of a global bit line is maintained within a forward diode drop of a bit line segment, no substantial current will flow and the bit line segment remains substantially isolated from the global bit line. A selected bit line segment may be biased at a voltage different enough from the global bit line voltage to turn on the isolation diode and provide a conduction path to the global bit line for sensing.

Referring now to Table 1, various contemplated embodiments are indicated, in which table "P" indicates a preferred embodiment, "A" indicates applicability, "L" indicates lower likelihood of application, and "X" indicates no probable advantage and likely, but not necessarily, even lower applicability.

TABLE 1

| Configuration: (may be used alone or combined with others) | Flash EEPROM | ROM | Passive Element | DRAM | FeRAM |
|---|---|---|---|---|---|
| Segmented bit lines on N layers, N segment switches, and a shared GBL | P | P | P | P | P |
| Switch for Bias side of cell through vertical connection to Line perpendicular to GBL | P | L | X | A | P |
| Switch for Bias side of cell through vertical connection to line parallel to GBL | A | P | X | A | A |
| A vs. B segment switch control for fewer GBLs | A | A | P | A | A |
| A vs. B segment switch control plus C vs. D bias switch control | P | P | X | A | P |
| Segments not sharing a word line share the vertical connection (zia) | P | P | P | P | P |

TABLE 1-continued

| Configuration: (may be used alone or combined with others) | Flash EEPROM | ROM | Passive Element | DRAM | FeRAM |
|---|---|---|---|---|---|
| A vs. B on opposite ends of interleaved segments for fewer GBLs | A | P | P | L | L |
| Half the GBLs above and half below | A | A | P | A | A |
| Full mirrored memory layers | A | A | P | L | L |
| Half mirrored memory layers | A | P | A | A | A |
| Two sets of layers and two vertical connections to two GBLs | A | A | A | A | A |
| Mirrored and two sets | A | A | P | L | L |
| Virtual ground array | A | A | X | L | L |

In the various embodiments, the connections between memory layers are advantageously formed as a vertical connection to reduce the overall area consumed by such connections. However, the use of such terms herein as "vertical connection" should be interpreted to include any manner of making a connection between vertically adjacent memory layers, whether using a separate via to connect each layer to it neighboring layer, whether such vias are stacked one atop another, whether each via is laterally displaced relative to the vias above and below it, or whether any other structure is used to fashion a connection between nodes on more than one memory layer. The invention is not limited to any particular form of "vertical connection," as different processes may result in more or less desirable choices for each process. Such a vertical connection may also be conveniently termed a "zia" to imply a via-type structure connecting more than one layer in the z-direction. Preferred zia structures are described in U.S. Pat. No. 6,534,403 to Cleeves, issued Mar. 18, 2003, the disclosure of which is hereby incorporated by reference in its entirety.

In various embodiments described herein, a number of memory cells per bit line segment has been assumed for convenience of description. It should be understood that, as with any memory array design, a number of factors may influence design decisions as to the number of memory cells per bit line segment. For example, the number of memory cells per bit line segment may be heavily influenced by the total leakage current which may affect a selected or unselected bit line segment, by resistance of the bit line segment and/or global bit line, or by capacitance of the bit line segment and/or global bit line. Similarly, the number of array blocks, the number of memory planes, and the number of global bit line layers are also a matter of engineering decision, and the exemplary configurations described herein are only examples of selected cases and not required configurations.

The capacitance per unit length of the global bit line is preferably lower than that of the bit line segments because the global bit line does not bear the capacitance of unselected bit line segments, and thus the overall capacitance of the bit line during sensing is reduced because only one of the many segmented bit lines associated with a given column is coupled to the global bit line. Preferably the capacitance per unit length of the global bit line is at least 5 times lower than that of a bit line segment. The overall resistance of the combined bit line may also be reduced because the global bit line may be implemented having a larger pitch than the bit line segments, and also may be implemented using a lower resistance material than the usually much shorter segmented bit lines that may be implemented using a material having a relatively high resistance per unit length. Preferably the resistance per unit length of the global bit line is at least 5 times lower than that of a bit line segment.

In certain embodiments, different types of memory cells may be combined within the same three-dimensional memory array within a single monolithic integrated circuit device. One memory plane may include memory cells of a different type than another memory plane. For example, a memory array may include Flash EEPROM memory cells on one or more levels, and single device ROM cells on one or more different levels. Passive element memory cell layers are envisioned in combination with at least one layer of diode-type ROM cells. Consequently, in certain embodiments of the invention, the various memory planes need not all have the same type of memory cell. As used herein, an integrated circuit memory array is a monolithic integrated circuit structure, rather than more than one integrated circuit device packaged together or in close proximity.

In addition, most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required for any of the embodiments of the present invention. For example, bit line segments on different layers may include different numbers of memory cells, the memory array may include three memory planes, bit line segments within the first and last array block may be different in number of memory cells or global bit line configuration, and any of many other irregular variations to the usual consistency of memory array design. Unless otherwise explicitly recited in the claims, such usual regularity, even as shown in the embodiments described herein, should not be imported into the meaning of any claim.

In many of the embodiments described above, the segment switch devices (sometimes referred to as block select devices) may be formed using the same process flow as the memory cells to reduce the number of process steps and device structures fabricated at each memory level. Thus the segment switch devices are formed having the same structure as the memory cells, although they may be sized differently (e.g., larger in width). As used herein, such segment switch devices may be considered to be structurally substantially identical to the memory cell devices, even though their respective threshold voltages may be programmed or erased to different values.

It should be appreciated that the designations top, left, bottom, and right are merely convenient descriptive terms for the four sides of a memory array. The word lines for a block may be implemented as two inter-digitated groups of word lines oriented horizontally, and the global bit lines for a block may be implemented as two inter-digitated groups of global bit line oriented vertically. Each respective group of word lines or global bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002, and in "Tree Decoder Structure Particularly Well Suited to Interfacing Array Lines Having Extremely Small Layout Pitch," U.S. patent application Ser. No. 10/306,888, filed Nov. 27, 2002, which applications are hereby incorporated by reference in their entirety.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are usually contemplated as being connected to the gate terminal of memory cell transistors, or the switch terminal of the memory cell switch device, if present. The Y-lines (or bit lines) are usually contemplated as being connected to a switched terminal of the memory cell (e.g., source/drain terminal). Secondly, the memory organization (e.g., data bus width, number of bits simultaneously read during an operation, etc.) may have some association with viewing one set of the two array lines more aligned with data "bits" rather than data "words." Consequently, the designations herein of X-lines, word lines, and row lines, and of Y-lines, bit lines, and column lines are illustrative of the various embodiments but should not be viewed in a restrictive sense, but rather a more general sense.

As used herein, word lines and bit lines (e.g., including bit line segments and global bit lines) usually represent orthogonal array lines, and generally follow a common assumption in the art that word lines are driven and bit lines are sensed, at least during a read operation. Thus, the global bit lines of an array may also be referred to as sense lines of the array, and may also be referred to as simply global array lines (i.e., even though other array lines also exist). No particular implication should be drawn as to word organization by use of such terms. Moreover, as used herein, a "global bit line" is an array line that connects to bit line segments in more than one memory block, but no particular inference should be drawn suggesting such a global bit line must traverse across an entire memory array or substantially across an entire integrated circuit.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). The programming state of the memory element can be read by sensing current flow or voltage drop when the memory element is selected.

In various embodiments of the invention described herein, the memory cells may be comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell is preferred. Other types of memory arrays, such as MRAM and organic passive element arrays, may also be used. MRAM (magnetoresistive random access memory) is based on magnetic memory elements, such as a magnetic tunnel junction (MTJ). MRAM technology is described in "A 256 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94-95, 404-405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

In various embodiments of the invention described herein, many different memory cell technologies are contemplated for use. Suitable memory cell structures and configurations useful for cross-point antifuse arrays (e.g., see FIG. 2) include, without limitation, those described in: U.S. Pat. No. 6,034,882 to Johnson, et al, entitled "Vertically Stacked Field Programmable Nonvolatile Memory and Method of Fabrication"; U.S. patent application Ser. No. 09/814,727 by Knall, et al, filed Mar. 21, 2001, entitled "Three-Dimensional Memory Array and Method of Fabrication"; U.S. patent application Ser. No. 09/928,536 by Johnson, filed Aug. 13, 2001, entitled "Vertically-Stacked, Field Programmable Nonvolatile Memory and Method of Fabrication"; U.S. patent application Ser. No. 10/185,508 by Cleeves, filed Jun. 27, 2002, entitled "Three Dimensional Memory"; and U.S. patent application Ser. No. 10/326,470 by Hemer, et al, filed Dec. 19, 2002, entitled "An Improved Method for Making a High Density Nonvolatile Memory". Each of these enumerated disclosures is incorporated herein by reference in its entirety.

Suitable memory cell structures and configurations useful for other array embodiments (e.g., ones similar to that shown in FIG. 3) include, without limitation, those described in: U.S. patent application Ser. No. 09/927,648 by Lee, et al, filed Aug. 13, 2001, entitled "Dense Arrays and Charge Storage Devices, and Methods for Making Same"; U.S. patent application Ser. No. 10/180,046 by Patel, et al, filed Jun. 27, 2002, entitled "High Density 3D Rail Stack Arrays and Method of Making"; U.S. patent application Ser. No. 10/325,951 by Ilkbahar, et al, filed Dec. 23, 2002, entitled "Semiconductor Device with Localized Charge Storage Dielectric and Method of Making Same"; U.S. patent application Ser. No. 10/335,078 by Scheuerlein, et al, filed Dec. 31, 2002, entitled "Programmable Memory Array Structure Incorporating Series-Connected Transistor Strings and Methods for Fabrication and Operation of Same"; and U.S. patent application Ser. No. 10/335,089 by Walker, et al, filed Dec. 31, 2002, entitled "Method for Fabricating Programmable Memory Array Structure Incorporating Series-Connected Transistor Strings". Each of these enumerated disclosures is incorporated herein by reference in its entirety.

The directionality of various array lines in the various figures is merely convenient for ease of description of the two groups of crossing lines in the array. While word lines are usually orthogonal to bit lines, such is not necessarily required. Moreover, the word and bit organization of a memory array may also be easily reversed. As an additional example, portions of an array may correspond to different output bits of a given word. Such various array organizations and configurations are well known in the art, and the invention is intended to comprehend a wide variety of such variations.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As used herein, two different voltages which are "substantially equal" to each other have respective values which are close enough to cause substantially the same effect under the context at issue. Such voltages may be assumed to fall within approximately 0.5 volts of each other, unless the context requires another value.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, a bit line segment within the selected block, and a memory cell within the selected bit line segment based upon address signals and possibly other control signals. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. Moreover, the embodiments described above are specifically contemplated to be used alone as well as in various combinations. Accordingly, other embodiments, variations, and improvements not described herein are not necessarily excluded from the scope of the invention.

What is claimed is:

1. A monolithic integrated circuit comprising:
   a three-dimensional memory array having at least two memory planes stacked one above the other, each memory plane comprising a respective plurality of segmented array lines of a first type and further comprising a respective plurality of segment switch devices, the three-dimensional memory array comprising a plurality of sub-arrays;
   a plurality of global bit line circuits each shared by a respective pair of adjacent sub-arrays, but disposed substantially beneath only one of the pair of adjacent sub-arrays; and
   a plurality of global array lines on at least one layer of the memory array;
   each segment switch device for coupling a segmented array line of the first type to an associated global array line, and each global array line being coupled to a respective segment switch device within each respective memory plane.

2. The integrated circuit of claim 1 further comprising a plurality of shared vertical connections in the memory array, each coupling at least two segment switch devices to an associated global array line.

3. The integrated circuit of claim 1 further comprising a plurality of shared vertical connections in the memory array, each coupling a respective segment switch device disposed within each of at least two respective memory planes to an associated global array line.

4. The integrated circuit of claim 1 wherein the global array lines run generally parallel to the segmented array lines of the first type.

5. The integrated circuit of claim 1 wherein the respective plurality of segmented array lines of the first type on at least two memory array layers are different in number.

6. The integrated circuit of claim 1 wherein a respective plurality of segment switch devices on at least two memory planes are different in number.

7. The integrated circuit of claim 1 wherein the plurality of segmented array lines of the first type on at least one memory array layer is different in number than the plurality of segment switch devices on at least one layer of the memory array.

8. The integrated circuit of claim 1 comprising EEPROM memory cells.

9. The integrated circuit of claim 1 comprising more than one type of memory cells within the three-dimensional memory array.

10. The integrated circuit of claim 1 further comprising:
a respective plurality of bias segment lines on each of at least one memory array layer, each associated with at least one segmented array line of the first type on the same memory array layer.

11. The integrated circuit of claim 1 wherein array lines on at least one given array line layer are associated with memory cells that are also associated with array lines on a vertically adjacent array line layer above the given array line layer, and also associated with other memory cells that are associated with array lines on a vertically adjacent array line layer below the given array line layer.

12. The integrated circuit of claim 1 comprising passive element memory cells.

13. The integrated circuit of claim 12 comprising anti-fuse memory cells.

14. The integrated circuit of claim 1 comprising memory cells having a switch device.

15. The integrated circuit of claim 14 comprising memory cell switch devices having a permanently modifiable threshold voltage.

16. The integrated circuit of claim 14 comprising memory cells including a capacitor to store memory state.

17. The integrated circuit of claim 14 comprising memory cells including a ferro-electric material.

18. The integrated circuit of claim 14 comprising segment switch devices which are substantially identical in structure to the memory cell switch devices.

19. The integrated circuit of claim 14 comprising segment switch devices which are substantially different in structure than the memory cell switch devices.

20. The integrated circuit of claim 14 comprising memory cell switch devices which include a charge storage dielectric.

21. The integrated circuit of claim 20 comprising SONOS memory cell switch devices.

22. A monolithic integrated circuit comprising:
a three-dimensional memory array having at least two memory planes stacked one above the other and further having a respective plurality of word lines on each of at least one layer of the memory array, having a respective plurality of bit line segments on each of at least one layer of the memory array, each memory plane comprising a vertically adjacent word line layer and segmented bit line layer, each memory plane comprising a plurality of memory segments, the three-dimensional array comprising a plurality of sub-arrays;
a plurality of global bit line circuits each shared by a respective pair of adjacent sub-arrays, but disposed substantially beneath only one of the pair of adjacent sub-arrays; and
a respective plurality of global bit lines on each of at least a first global bit line layer;
wherein each memory segment comprises a bit line segment and a segment switch device for coupling the bit line segment to an associated global bit line; and
wherein each global bit line is coupled to a respective segment switch device disposed within each respective memory plane.

23. The integrated circuit of claim 22 further comprising a plurality of shared vertical connections in the memory array, each coupling at least two memory segments to an associated global bit line.

24. The integrated circuit of claim 22 further comprising a plurality of shared vertical connections in the memory array, each coupling at least one memory segment on each of at least two respective memory planes to an associated global bit line.

25. The integrated circuit of claim 22 comprising EEPROM memory cells.

26. The integrated circuit of claim 22 comprising more than one type of memory cells within the three-dimensional memory array.

27. The integrated circuit of claim 22 further comprising:
a respective plurality of global bias lines on at least a first global bias line layer;
wherein each memory segment comprises a respective bias line segment and a respective bias switch device for coupling the respective bias line segment to an associated global bias line.

28. The integrated circuit of claim 22 comprising passive element memory cells.

29. The integrated circuit of claim 28 comprising anti-fuse memory cells.

30. The integrated circuit of claim 22 wherein the global bit lines run generally parallel to the bit line segments.

31. The integrated circuit of claim 30 comprising global bit lines having a resistance per unit length which is a least a factor of 5 lower than that of a bit line segment.

32. The integrated circuit of claim 30 comprising global bit lines having a capacitance per unit length which is a least a factor of 5 lower than that of a bit line segment.

33. The integrated circuit of claim 22 wherein respective pairs of adjacent memory segments are associated with a single respective bit line segment disposed therebetween, having a respective segment switch device for coupling the respective bit line segment to an associated global bit line.

34. The integrated circuit of claim 33 further comprising:
a respective plurality of global bias lines on at least a first global bias line layer; and
wherein respective pairs of adjacent memory segments are associated with a respective bias line segment therebetween, having a respective bias switch device for coupling the respective bias line segment to an associated global bias line.

35. The integrated circuit of claim 34 wherein:
adjacent memory segments associated with the same bit line segment are associated with different global bias lines.

36. The integrated circuit of claim 22 comprising memory cells having a switch device.

37. The integrated circuit of claim 36 comprising memory cell switch devices having a permanently modifiable threshold voltage.

38. The integrated circuit of claim 36 comprising memory cells including a capacitor to store memory state.

39. The integrated circuit of claim 36 comprising memory cells including a ferro-electric material.

40. The integrated circuit of claim 36 comprising segment switch devices which are substantially identical in structure to the memory cell switch devices.

41. The integrated circuit of claim 36 comprising memory cell switch devices which include a charge storage dielectric.

42. The integrated circuit of claim 41 comprising SONOS memory cell switch devices.

43. The integrated circuit of claim 36 comprising segment switch devices which are substantially different in structure than the memory cell switch devices.

44. The integrated circuit of claim 43 comprising SONOS memory cell devices.

45. The integrated circuit of claim 44 comprising segment switch devices which contain no nitride but are otherwise substantially identical to the memory cell switch devices.

* * * * *